(12) United States Patent
Kwak et al.

(10) Patent No.: US 11,894,414 B2
(45) Date of Patent: Feb. 6, 2024

(54) DISPLAY DEVICE

(71) Applicant: Samsung Display Co., LTD., Yongin-si (KR)

(72) Inventors: Jin Seon Kwak, Yongin-si (KR); No Kyung Park, Yongin-si (KR); Kyung Bae Kim, Yongin-si (KR); Ji Hye Lee, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 166 days.

(21) Appl. No.: 17/395,012

(22) Filed: Aug. 5, 2021

(65) Prior Publication Data

US 2022/0199676 A1   Jun. 23, 2022

(30) Foreign Application Priority Data

Dec. 23, 2020   (KR) .................. 10-2020-0182613

(51) Int. Cl.
  *H01L 27/15*   (2006.01)
  *H01L 25/00*   (2006.01)

(52) U.S. Cl.
  CPC ............ *H01L 27/156* (2013.01); *H01L 25/00* (2013.01)

(58) Field of Classification Search
  None
  See application file for complete search history.

(56) References Cited

U.S. PATENT DOCUMENTS

| | | | |
|---|---|---|---|
| 7,863,814 B2 | 1/2011 | Mitsuya et al. | |
| 10,211,418 B2 | 2/2019 | Im et al. | |
| 10,276,630 B2 | 4/2019 | Lee et al. | |
| 10,461,123 B2 | 10/2019 | Kim et al. | |
| 10,600,855 B2 | 3/2020 | Song et al. | |
| 2003/0127657 A1* | 7/2003 | Park | H10K 59/122 257/79 |
| 2008/0303424 A1 | 12/2008 | Mitsuya et al. | |
| 2014/0117341 A1* | 5/2014 | Song | H10K 59/122 438/46 |
| 2014/0159043 A1* | 6/2014 | Sakariya | H01L 25/0753 438/34 |
| 2019/0096925 A1* | 3/2019 | Lee | H01L 27/124 |
| 2021/0327954 A1 | 10/2021 | Cho et al. | |

FOREIGN PATENT DOCUMENTS

| | | |
|---|---|---|
| KR | 10-1452370 | 10/2014 |
| KR | 10-2018-0009015 | 1/2018 |
| KR | 10-2018-0011404 | 2/2018 |
| KR | 10-2018-0072909 | 7/2018 |
| KR | 10-2020-0105598 | 9/2020 |
| WO | 2020/009274 | 1/2020 |

* cited by examiner

*Primary Examiner* — Robert K Carpenter
(74) *Attorney, Agent, or Firm* — KILE PARK REED & HOUTTEMAN PLLC

(57) ABSTRACT

A display device may include a substrate including pixels; a first bank that defines an emission area of the pixels; a first electrode and a second electrode spaced apart from each other in the emission area; a first insulating layer disposed on the first electrode and the second electrode; light emitting elements disposed on the first insulating layer between the first electrode and the second electrode; a second insulating layer disposed on the first bank; a first opening passing through the first insulating layer; and a second opening passing through the second insulating layer. The first opening and the second opening may overlap the first bank.

23 Claims, 16 Drawing Sheets

DISPLAY DEVICE

CROSS-REFERENCE TO RELATED APPLICATION(S)

This application claims priority to and the benefit of Korean Patent Application No. 10-2020-0182613 under 35 U.S.C. § 119, filed in the Korean Intellectual Property Office (KIPO) on Dec. 23, 2020, the entire contents of which are incorporated herein by reference.

BACKGROUND

1. Technical Field

Various embodiments of the disclosure relate to a display device.

2. Description of Related Art

Recently, as interest in information display increases, research and development on display devices have been continuously conducted.

SUMMARY

Various embodiments of the disclosure are directed to a display device capable of reducing or minimizing defects attributable to outgas.

The objects of the disclosure are not limited to the above-stated objects, and those skilled in the art will clearly understand other not mentioned objects from the accompanying claims.

An embodiment of the disclosure may provide a display device including a substrate including pixels; a first bank that defines an emission area of the pixels; a first electrode and a second electrode spaced apart from each other in the emission area; a first insulating layer disposed on the first electrode and the second electrode; light emitting elements disposed on the first insulating layer between the first electrode and the second electrode; a second insulating layer disposed on the first bank; a first opening passing through the first insulating layer; and a second opening passing through the second insulating layer. The first opening and the second opening may overlap the first bank.

In an embodiment, the second opening may expose the first bank.

In an embodiment, the first opening may overlap the second opening.

In an embodiment, a surface area of the first opening may be greater than a surface area of the second opening.

In an embodiment, a surface area of the first opening may be less than a surface area of the second opening.

In an embodiment, the first opening and the second opening may extend in a first direction.

In an embodiment, the first bank may be disposed between the first insulating layer and the second insulating layer.

In an embodiment, the display device may further include a second bank disposed between the substrate and the first bank.

In an embodiment, the first opening may expose the second bank.

In an embodiment, the first bank may contact the second bank through the first opening.

In an embodiment, the display device may include a third insulating layer disposed on the second insulating layer; and a third opening passing through the second insulating layer and the third insulating layer.

In an embodiment, the third opening may overlap the first bank.

In an embodiment, the third opening may expose the first bank.

In an embodiment, the third insulating layer may contact the first bank through the second opening.

In an embodiment, the second opening and the third opening may be disposed alternately with each other in a first direction.

In an embodiment, the second opening and the third opening may extend in a first direction.

In an embodiment, the second opening and the third opening may be spaced apart from each other in a second direction intersecting the first direction.

In an embodiment, the display device may further include a first connection electrode disposed on the third insulating layer; and a second connection electrode disposed between the second insulating layer and the third insulating layer.

In an embodiment, the first connection electrode may electrically contact an end of each of the light emitting elements, and the second connection electrode may electrically contact another end of each of the light emitting elements.

In an embodiment, at least one of the first insulating layer, the second insulating layer, and the third insulating layer may include an inorganic material.

Details of various embodiments are included in the detailed descriptions and drawings.

DETAILED DESCRIPTION OF THE EMBODIMENTS

Figure 1:
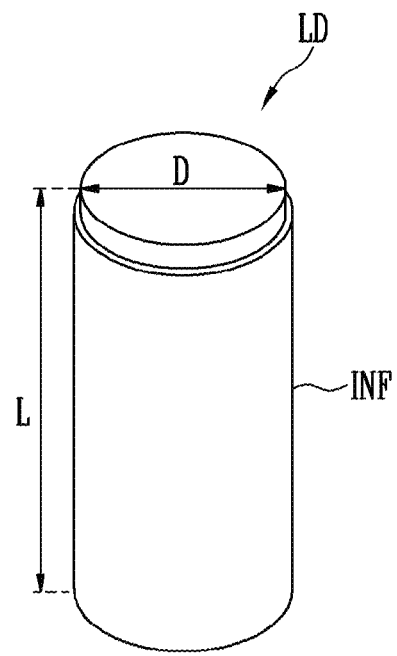
FIGS. 1 and 2 are a perspective view and a cross-sectional view schematically illustrating a light emitting element in accordance with an embodiment of the disclosure.

Advantages and features of the disclosure, and methods for achieving the same will be discussed with reference to embodiments in detail together with the accompanying drawings. The disclosure is not limited to the following embodiments, and various modifications are possible. These embodiments are provided so that this disclosure will be thorough and complete and will convey the concept of the disclosure to those skilled in the art.

The terminology used herein is for the purpose of describing particular embodiments only and is not intended to be limiting of embodiments. In this specification, the terms of a singular form may include plural forms unless specifically mentioned. It will be further understood that the terms "comprises" and/or "comprising," when used in this specification, specify the presence of stated features, steps, operations and/or components do not preclude the presence or addition of one or more features, steps, operations and/or components.

Furthermore, the term "coupling" or "connection" may comprehensively refer to physical and/or electrical coupling or connection. In addition, the term "coupling" or "connection" may comprehensively refer to direct or indirect coupling or connection and integral or non-integral coupling or connection.

It will be understood that when an element or a layer is referred to as being "on" another element or a layer, it can be directly on, connected to, or coupled to the other element or the layer, or one or more intervening elements or layers may be present. Like reference numerals refer to like elements throughout.

It will be understood that, although the terms "first," "second," and the like may be used herein to describe various elements, these elements should not be limited by these terms. These terms are only used to distinguish one element from another element. For instance, a first element discussed below could be termed a second element without departing from the teachings of the disclosure.

The phrase "at least one of" is intended to include the meaning of "at least one selected from the group of" for the purpose of its meaning and interpretation. For example, "at least one of A and B" may be understood to mean "A, B, or A and B."

Unless otherwise defined or implied herein, all terms (including technical and scientific terms) used herein have the same meaning as commonly understood by those skilled in the art to which this disclosure pertains. It will be further understood that terms, such as those defined in commonly used dictionaries, should be interpreted as having a meaning that is consistent with their meaning in the context of the relevant art and the disclosure, and should not be interpreted in an ideal or excessively formal sense unless clearly so defined herein.

Hereinafter, embodiments of the disclosure will be described in detail with reference to the accompanying drawings.

Figure 2:
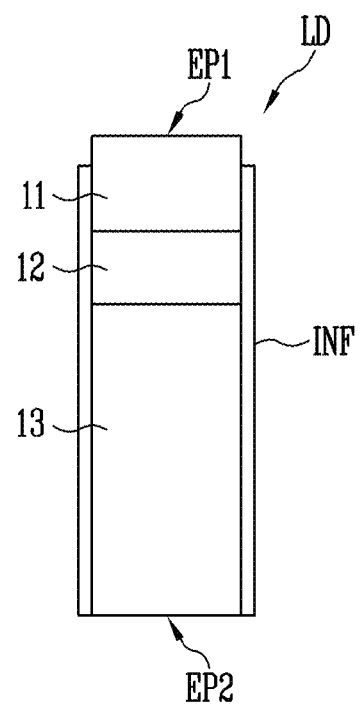

FIGS. 1 and 2 are a schematic perspective view and a schematic cross-sectional view illustrating a light emitting element in accordance with an embodiment. Although FIGS. 1 and 2 illustrate a column-type (or columnar) light emitting element LD, the type and/or shape of the light emitting element LD is not limited thereto.

Referring to FIGS. 1 and 2, the light emitting element LD may include a first semiconductor layer 11, a second semiconductor layer 13, and an active layer 12 interposed between the first and second semiconductor layers 11 and 13. For example, if a direction in which the light emitting element LD extends refers to a longitudinal direction (L), the light emitting element LD may include the first semiconductor layer 11, the active layer 12, and the second semiconductor layer 13 which are sequentially or successively stacked in the longitudinal direction (L).

The light emitting element LD may be provided in the form of a column extending in a direction. The light emitting element LD may include a first end EP1 and a second end EP2. The first semiconductor layer 11 may be disposed on the first end EP1 of the light emitting element LD, and the second semiconductor layer 13 may be disposed on the second end EP2 of the light emitting element LD, but the disclosure is not limited thereto.

In an embodiment, the light emitting element LD may be a light emitting element manufactured in a columnar shape by an etching method or the like. In this specification, the term "column-type" or "columnar shape" may mean a rod-like shape and a bar-like shape such as a cylindrical shape and a prismatic shape extending in a longitudinal direction (i.e., having an aspect ratio greater than 1), and the cross-sectional shape thereof is not limited to a particular shape. For example, the length L of the light emitting element LD may be greater than a diameter D thereof (or a width of the cross-section thereof).

The light emitting element LD may have a small size corresponding to a range from the nanometer scale to the micrometer scale. For example, each light emitting element LD may have a diameter D (or a width) and/or a length L ranging from the nanometer scale to the micrometer scale. However, the size of the light emitting element LD is not limited thereto, and the size of the light emitting element LD may be changed in various ways depending on design conditions of various devices, e.g., a display device, using a light emitting device with the light emitting element LD as a light source.

The first semiconductor layer 11 may be a first conductive semiconductor layer. For example, the first semiconductor layer 11 may include a p-type semiconductor layer. For instance, the first semiconductor layer 11 may include a p-type semiconductor layer which includes a semiconductor material of InAlGaN, GaN, AlGaN, InGaN, AlN, and InN and is doped with a first conductive dopant such as Mg. However, the material for forming the first semiconductor layer 11 is not limited to this, and the first semiconductor layer 11 may be formed of various other materials.

The active layer 12 may be disposed on the first semiconductor layer 11 and have a single-quantum well structure or a multi-quantum well structure. The location of the active layer 12 may be changed in various ways depending on the type of the light emitting element LD. A cladding layer (not shown) doped with a conductive dopant may be selectively formed on and/or under the active layer 12. For example, the cladding layer may be formed of AlGaN or InAlGaN. In an embodiment, a material such as AlGaN or InAlGaN may be used to form the active layer 12, and various other materials may be used to form the active layer 12.

The second semiconductor layer 13 may be disposed on the active layer 12 and include a semiconductor layer having a type different from that of the first semiconductor layer 11. For example, the second semiconductor layer 13 may include an n-type semiconductor layer. For instance, the second semiconductor layer 13 may include an n-type semiconductor layer which includes a semiconductor material of InAlGaN, GaN, AlGaN, InGaN, AlN, and InN and is doped with a second conductive dopant such as Si, Ge, or Sn. However, the material for forming the second semiconductor layer 13 is not limited to this, and the second semiconductor layer 13 may be formed of various other materials.

If a voltage equal to or greater than a threshold voltage is applied to each of the opposite ends of the light emitting element LD, the light emitting element LD may emit light by coupling of electron-hole pairs in the active layer 12. Since light emission of the light emitting element LD is controlled based on the foregoing principle, the light emitting element LD may be used as a light source of various light emitting devices as well as a pixel of the display device.

The light emitting element LD may further include an insulating film INF provided on a surface of the light emitting element LD. The insulating film INF may be formed on the surface of the light emitting element LD to enclose at least the active layer 12 and may further enclose an area of each of the first and second semiconductor layers 11 and 13.

The insulating film INF may allow the opposite ends of the light emitting element LD that have different polarities to be exposed to the outside. For example, the insulating film INF may allow an end of each of the first and second semiconductor layers 11 and 13 respectively disposed on the first and second ends EP1 and EP2 of the light emitting element LD to be exposed. In an embodiment, the insulating film INF may allow a side portion of each of the first and second semiconductor layers 11 and 13 respectively adjacent to the first and second ends EP1 and EP2 of the light emitting element LD having different polarities to be exposed.

The insulating film INF may have a single-layer structure or a multi-layer structure (e.g., a double-layer structure formed of aluminum oxide ($AlO_x$) and silicon oxide ($SiO_x$)) including at least one insulating material among silicon oxide ($SiO_x$), silicon nitride ($SiN_x$), silicon oxynitride ($SiO_xN_y$), aluminum oxide ($AlO_x$), and titanium oxide ($TiO_x$). However, the disclosure is not limited thereto. In an embodiment, the insulating film INF may be omitted.

If the insulating film INF covers the surface of the light emitting element LD, particularly, the outer circumferential surface of the active layer 12, even in case that light emitting elements LD are disposed adjacent to each other, the light emitting elements LD may be prevented from undesirably short-circuiting. Furthermore, surface defects of the light emitting elements LD may be minimized, so that the lifetime and the efficiency of the light emitting element LD may be enhanced.

In an embodiment, the light emitting element LD may further include an additional component as well as the first semiconductor layer 11, the active layer 12, the second semiconductor layer 13, and/or the insulating film INF that encloses the first semiconductor layer 11, the active layer 12, and the second semiconductor layer 13. For example, the light emitting element LD may further include at least one fluorescent layer, at least one active layer, at least one semiconductor layer and/or at least one electrode layer disposed on one end (or first end) of the first semiconductor layer 11, the active layer 12, and/or the second semiconductor layer 13. For example, an electrode layer may be disposed on each of the first and second ends EP1 and EP2 of the light emitting element LD.

Although FIGS. 1 and 2 illustrate a columnar light emitting element LD, the type, structure, and/or shape of the light emitting element LD may be changed in various ways. For example, the light emitting element LD may be formed in a core-shell structure having a polypyramidal shape.

A light emitting device including the light emitting element LD described above may be used not only in a display device but also in various devices which require a light source. For instance, light emitting elements LD may be disposed in each pixel of a display panel, so that the light emitting elements LD may be used as a light source of the pixel. However, the application field of the light emitting element LD is not limited to the above-mentioned examples. For example, the light emitting element LD may also be used in other types of devices such as a lighting device, which require a light source.

Figure 3:
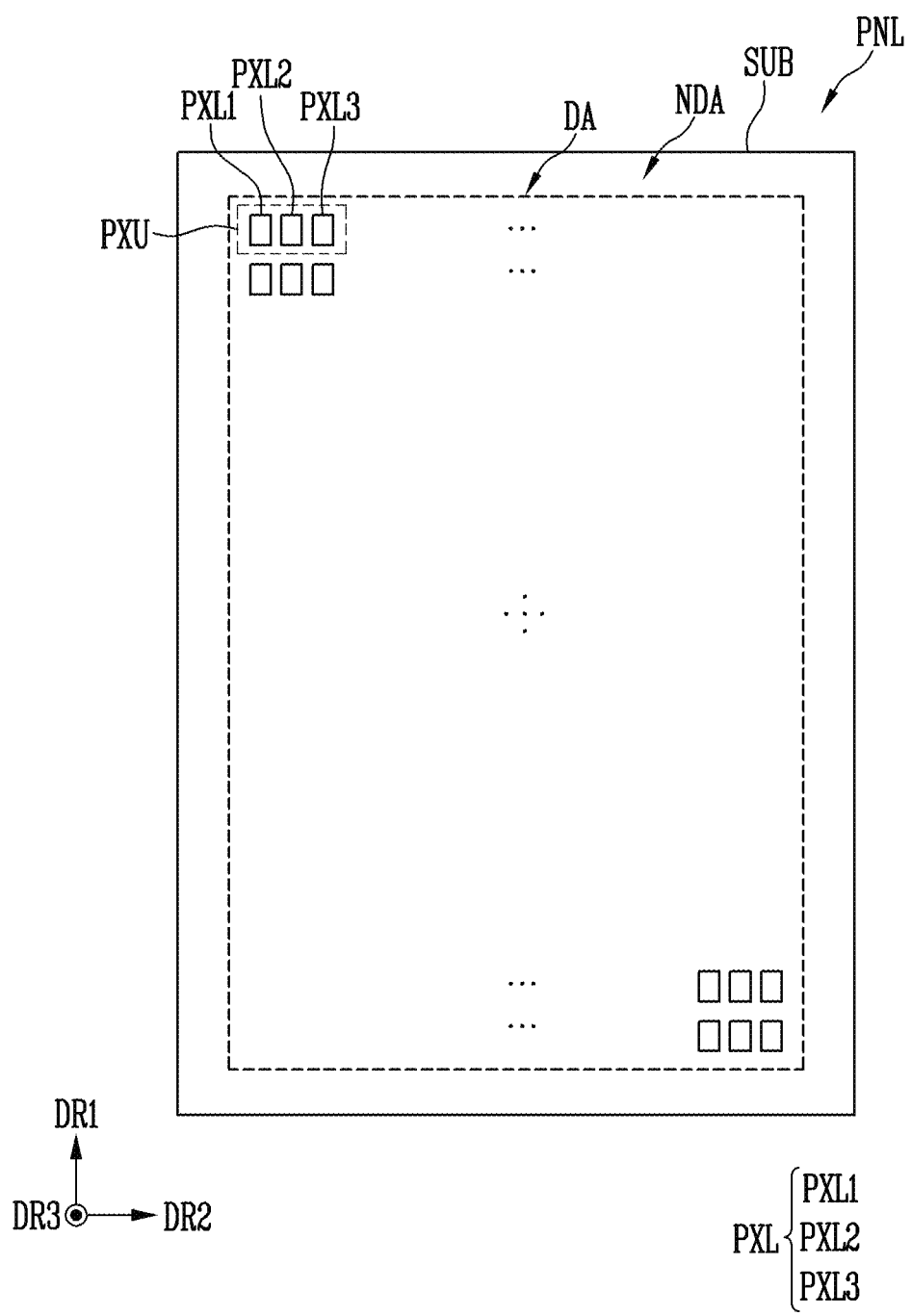
FIG. 3 is a plan view schematically illustrating a display device in accordance with an embodiment of the disclosure.

FIG. 3 is a schematic plan view illustrating a display device in accordance with an embodiment.

FIG. 3 illustrates a display device, particularly, a display panel PNL provided in the display device, as an example of an electronic device which may use, as a light source, the light emitting element LD described in the embodiments of FIGS. 1 and 2.

Each pixel unit PXU of the display panel PNL and each pixel for forming the pixel unit PXU may include at least one light emitting element LD. For the sake of explanation, FIG. 3 simply illustrates the structure of the display panel PNL in accordance with an embodiment, focusing on a display area DA. In some embodiments, although not illustrated, at least one driving circuit (e.g., at least one of a scan driver and a data driver), lines, and/or pads may be further provided on the display panel PNL.

Referring to FIG. 3, the display panel PNL may include a substrate SUB, and a pixel unit PXU disposed on the substrate SUB. The pixel unit PXU may include first pixels PXL1, second pixels PXL2, and/or third pixels PXL3. In the following embodiments, the term "pixel PXL" or "pixels PXL" will be used to arbitrarily designate at least one pixel among the first pixels PXL1, the second pixels PXL2, and the third pixels PXL3, or collectively designate two or more kinds of pixels thereamong.

The substrate SUB may form a base of the display panel PNL and be a rigid or flexible substrate or film. For example, the substrate SUB may be a rigid substrate made of glass or reinforced glass, or a flexible substrate (or a thin film) formed of (or including) plastic or metal, and the material and/or properties of the substrate SUB are not particularly limited.

The display panel PNL and the substrate SUB for forming the display panel PNL may include a display area DA for displaying an image and a non-display area NDA formed in a predetermined area other than the display area DA. The pixels PXL are disposed in the display area DA. Various lines and/or pads electrically connected to the pixels PXL may be disposed in the non-display area NDA. The pixels PXL may be regularly arranged in a stripe or PenTile® arrangement structure. The arrangement structure of the pixels PXL is not limited thereto, and the pixels PXL may be arranged in the display area DA in various structures and/or schemes.

In an embodiment, two or more kinds of pixels PXL which emit different colors of light may be disposed in the display area DA. For example, first pixels PXL1 configured to emit a first color of light, second pixels PXL2 configured to emit a second color of light, and a third pixels PXL3 configured to emit a third color of light may be arranged in the display area DA. At least one first pixel PXL1, at least one second pixel PXL2, and at least one third pixel PXL3 that are disposed adjacent to each other may form a pixel unit PXU which may emit light having various colors. For example, each of the first to third pixels PXL1, PXL2, and PXL3 may be a sub-pixel configured to emit a predetermined color of light. In an embodiment, the first pixel PXL1 may be a red pixel which emits red light, a second pixel PXL2 may be a green pixel which emits green light, and a third pixel PXL3 may be a blue pixel which emits blue light. However, the disclosure is not limited thereto.

In an embodiment, the first pixel PXL1, the second pixel PXL2, and the third pixel PXL3 may include, as light sources, a light emitting element of the first color, a light emitting element of the second color, and a light emitting element of the third color, so that the first to third pixels PXL1, PXL2, and PXL3 may respectively emit the first color of light, the second color of light, and the third color of light. In an embodiment, the first pixel PXL1, the second pixel PXL2, and the third pixel PXL3 may respectively include light emitting elements configured to emit a same color of light and color filters and color conversion layers having different colors may be disposed on the respective light emitting elements so that the first to third pixels PXL1, PXL2, and PXL3 may emit the first color of light, the second color of light, and the third color of light. However, the colors, types, and/or number of pixels PXL that form each pixel unit PXU are not particularly limited. In other words, the color of light to be emitted from each pixel PXL may be changed in various ways.

The pixel PXL may include at least one light source which is driven by a control signal (e.g., a scan signal and a data signal) and/or a power supply (e.g., a first power supply and a second power supply). In an embodiment, the light source may include at least one light emitting element LD in accordance with one of the embodiments of FIGS. 1 and 2, e.g., subminiature column-type light emitting elements LD having a small size corresponding to a range from the nanometer scale to the micrometer scale. However, the disclosure is not limited thereto, and different types of light emitting elements LD may be used as a light source of the pixel PXL.

Figure 4:
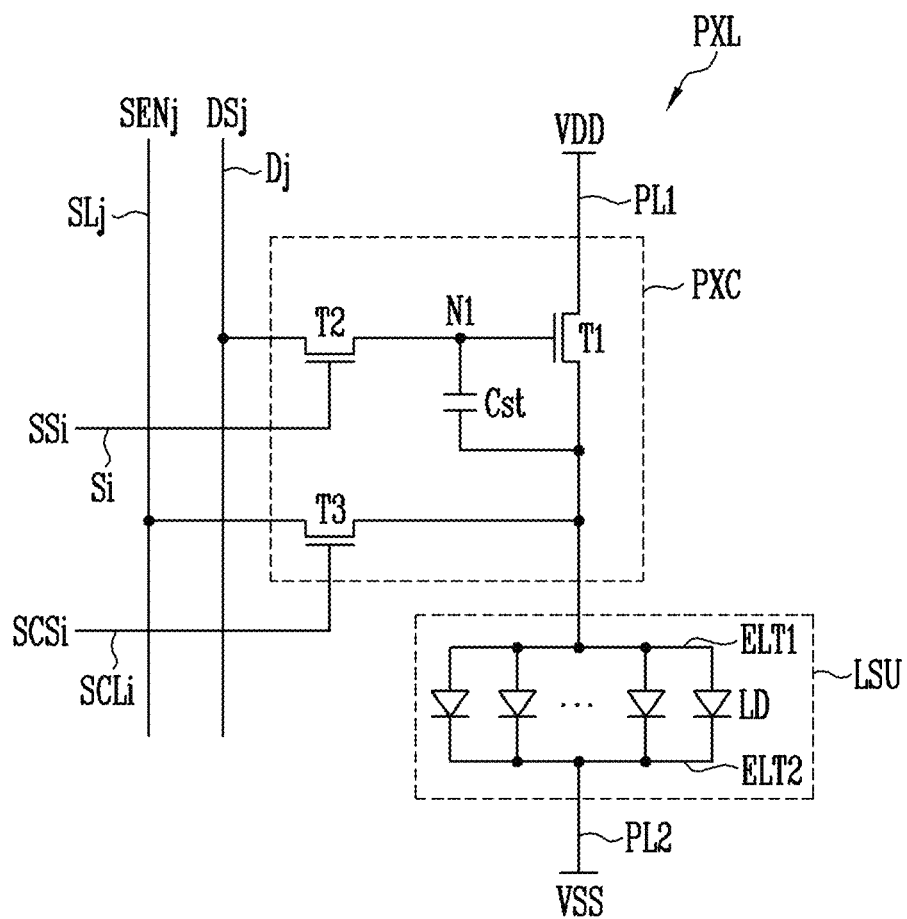
FIG. 4 is a circuit diagram schematically illustrating a pixel in accordance with an embodiment of the disclosure.

FIG. 4 is a schematic equivalent circuit diagram illustrating a pixel in accordance with an embodiment.

In an embodiment, the pixel PXL illustrated in FIG. 4 may be one of the first pixel PXL1, the second pixel PXL2, and the third pixel PXL3 which are provided on the display panel PNL of FIG. 3. The first pixel PXL1, the second pixel PXL2, and the third pixel PXL3 may have a substantially identical or similar structure.

Referring to FIG. 4, the pixel PXL may include an emission circuit LSU that generates light having a luminance corresponding to a data signal, and a pixel circuit PXC that drives the emission circuit LSU.

The emission circuit LSU may include at least one light emitting element LD electrically connected between a first power supply VDD and a second power supply VSS. For example, the emission circuit LSU may include a first electrode ELT1 (referred also to as "first pixel electrode" or "first alignment electrode") electrically connected to the first power supply VDD via the pixel circuit PXC and a first power line PL1, a second electrode ELT2 (referred also to as "second pixel electrode" or "second alignment electrode") electrically connected to the second power supply VSS through a second power line PL2, and light emitting elements LD electrically connected between the first and second electrodes ELT1 and ELT2. In an embodiment, the first electrode ELT1 may be an anode electrode, and the second electrode ELT2 may be a cathode electrode.

Each of the light emitting elements LD may include a first end electrically connected to the first power supply VDD through the first electrode ELT1 and/or the pixel circuit PXC, and a second end electrically connected to the second power supply VSS through the second electrode ELT2. In other words, the light emitting elements LD may be electrically connected in a forward direction between the first electrode ELT1 and the second electrode ELT2. Each of the light emitting elements LD electrically connected in the forward direction between the first power supply VDD and the second power supply VSS may form a valid light source. The valid light sources may form the emission circuit LSU of the pixel PXL.

The first power supply VDD and the second power supply VSS may have different potentials to allow the light emitting elements LD to emit light. For example, the first power supply VDD may be set as a high-potential power supply, and the second power supply VSS may be set as a low-potential power supply. Here, a difference in potential between the first power supply VDD and the second power supply VSS may be set to a threshold voltage or higher of the light emitting elements LD or more during at least an emission period of the pixel PXL.

The first ends of the light emitting elements LD that form each emission unit LSU may be electrically connected in common to the pixel circuit PXC through an electrode of the emission unit LSU (e.g., the first electrode ELT1 of each pixel PXL) and be electrically connected to the first power supply VDD through the pixel circuit PXC and the first power line PL1. The second ends of the light emitting elements LD may be electrically connected in common to the second power supply VSS through another electrode of the emission circuit LSU (e.g., the second electrode ELT2 of each pixel PXL) and the second power line PL2.

The light emitting elements LD may emit light having a luminance corresponding to driving current supplied thereto through the corresponding pixel circuit PXC. For example, during each frame period, the pixel circuit PXC may supply, to the emission circuit LSU, driving current corresponding to a grayscale value to be expressed in a corresponding frame. The driving current supplied to the emission circuit LSU may be distributed to the light emitting elements LD electrically connected in the forward direction. Therefore, each of the light emitting elements LD may emit light having a luminance corresponding to current applied thereto, so that the emission circuit LSU may emit light having a luminance corresponding to the driving current.

The pixel circuit PXC may be electrically connected between the first power supply VDD and the first electrode ELT1. The pixel circuit PXC may be electrically connected to a scan line Si and a data line Dj of the corresponding pixel PXL. For example, if the pixel PXL is disposed in an i-th horizontal line (row) (where i is a natural number) and a j-th vertical line (column) (where j is a natural number) of the display area DA, the pixel circuit PXC may be electrically connected to an i-th scan line Si and a j-th data line Dj of the display area DA.

In an embodiment, the pixel circuit PXC may include first, second, and third transistors T1, T2, and T3 and at least one storage capacitor Cst.

The first transistor T1 may be electrically connected between the first power supply VDD and the emission circuit LSU. For example, a first electrode (e.g., a source electrode) of the first transistor T1 may be electrically connected to the first power supply VDD, and a second electrode (e.g., a drain electrode) of the first transistor T1 may be electrically connected to the first electrode ELT1. A gate electrode of the first transistor T1 may be electrically connected to a first node N1. The first transistor T1 may control driving current to be supplied to the emission circuit LSU in response to a voltage of the first node N1. In other words, the first transistor T1 may be a driving transistor that controls the driving current of the pixel PXL.

The second transistor T2 may be electrically connected between the data line Dj and the first node N1. For example, a first electrode (e.g., a source electrode) of the second transistor T2 may be electrically connected to the data line Dj, and a second electrode (e.g., a drain electrode) of the second transistor T2 may be electrically connected to the first node N1. A gate electrode of the second transistor T2 may be electrically connected to the scan line Si. In case that a scan signal having a gate-on voltage (e.g., a low-level voltage) is supplied from the scan line Si to the second transistor T2, the second transistor T2 may be turned on to electrically connect the first node N1 to the data line Dj.

During each frame period, a data signal DSj of a corresponding frame is supplied to the data line Dj, and the data signal DSj is transmitted to the first node N1 through the second transistor T2 that is turned on during a period in which a scan signal SSi having the gate-on voltage is supplied thereto. In other words, the second transistor T2 may be a switching transistor configured to transmit each data signal DSj to the interior of the pixel PXL.

The third transistor T3 may be electrically connected between the first transistor T1 and a sensing line SLj. For example, a first electrode of the third transistor T3 may be electrically connected to an electrode (e.g., a source electrode) of the first transistor T1 electrically connected to the first electrode ELT1, and a second electrode of the third transistor T3 may be electrically connected to the sensing line SLj. In case that the sensing line SLj is omitted, the second electrode of the third transistor T3 may be electrically connected to the data line Dj.

A gate electrode of the third transistor T3 may be electrically connected to a sensing control line SCLi. In case that the sensing control line SCLi is omitted, the gate electrode of the third transistor T3 may be electrically connected to the scan line Si. The third transistor T3 may be turned on by a sensing control signal SCSi having a gate-on voltage (e.g., a high-level voltage) supplied to the sensing control line SCLi during a sensing period, to thus electrically connect the sensing line SLj with the first transistor T1.

In an embodiment, the sensing period may be a period in which characteristics of each of the pixels PXL disposed in the display area DA (e.g., a threshold voltage, etc. of the first transistor T1) are extracted. During the sensing period, the first transistor T1 may be turned on by supplying a predetermined reference voltage capable of turning on the first transistor T1 to the first node N1 through the data line Dj and the second transistor T2, or electrically connecting each pixel PXL to a current source or the like. Furthermore, the third transistor T3 may be turned on by supplying a sensing control signal SCSi having a gate-on voltage to the third transistor T3, so that the first transistor T1 can be coupled to the sensing line SLj. Thereafter, a sensing signal SENj may be obtained through the sensing line SLj, and characteristics of each pixel PXL including the threshold voltage or the like of the first transistor T1 may be detected using the sensing signal SENj. Information about the characteristics of each pixel PXL may be used to convert image data such that a deviation in characteristic between pixels PXL disposed in the display area DA can be compensated for.

A first electrode of the storage capacitor Cst may be electrically connected to the first power supply VDD, and a second electrode thereof may be electrically connected to the first node N1. The storage capacitor Cst may be charged with a voltage corresponding to a data signal DSj to be supplied to the first node N1 during each frame period.

Although FIG. 4 illustrates an embodiment where all of the first to third transistors T1, T2, and T3 are n-type transistors, the disclosure is not limited thereto. For example, at least one of the first to third transistors T1, T2, and T3 may be changed to a p-type transistor.

Furthermore, although FIG. 4 illustrates an embodiment in which all valid light sources, for example, light emitting elements LD, for forming each emission circuit LSU are electrically connected in parallel to each other, the disclosure is not limited thereto. For example, the emission circuit LSU of each pixel PXL may include an at least two-stage serial structure. The light emitting elements that form each serial stage may be electrically connected in series to each other by at least one intermediate electrode.

On the assumption that the emission circuit LSU is configured or formed using the light emitting elements LD having the same conditions (e.g., the same size and/or number) as valid light sources, if the light emitting elements LD are electrically connected to each other in serials or in a serial/parallel combination structure, the power efficiency can be enhanced. For example, in the emission circuit LSU in which the light emitting elements LD are coupled in series or serial/parallel structure, the luminance to be expressed (or displayed) based on the same current may be higher than that of the case where the light emitting elements LD are electrically connected only in parallel to each other. Furthermore, in the pixel PXL in which the light emitting elements LD are electrically connected in series or in a serial/parallel combination structure, even if a short-circuit defect or the like occurs in some serial stages, the luminance can be expressed by the light emitting elements LD of the other serial stages, so that the probability of occurrence of a black spot defect in the pixel PXL can be reduced.

Figure 5:
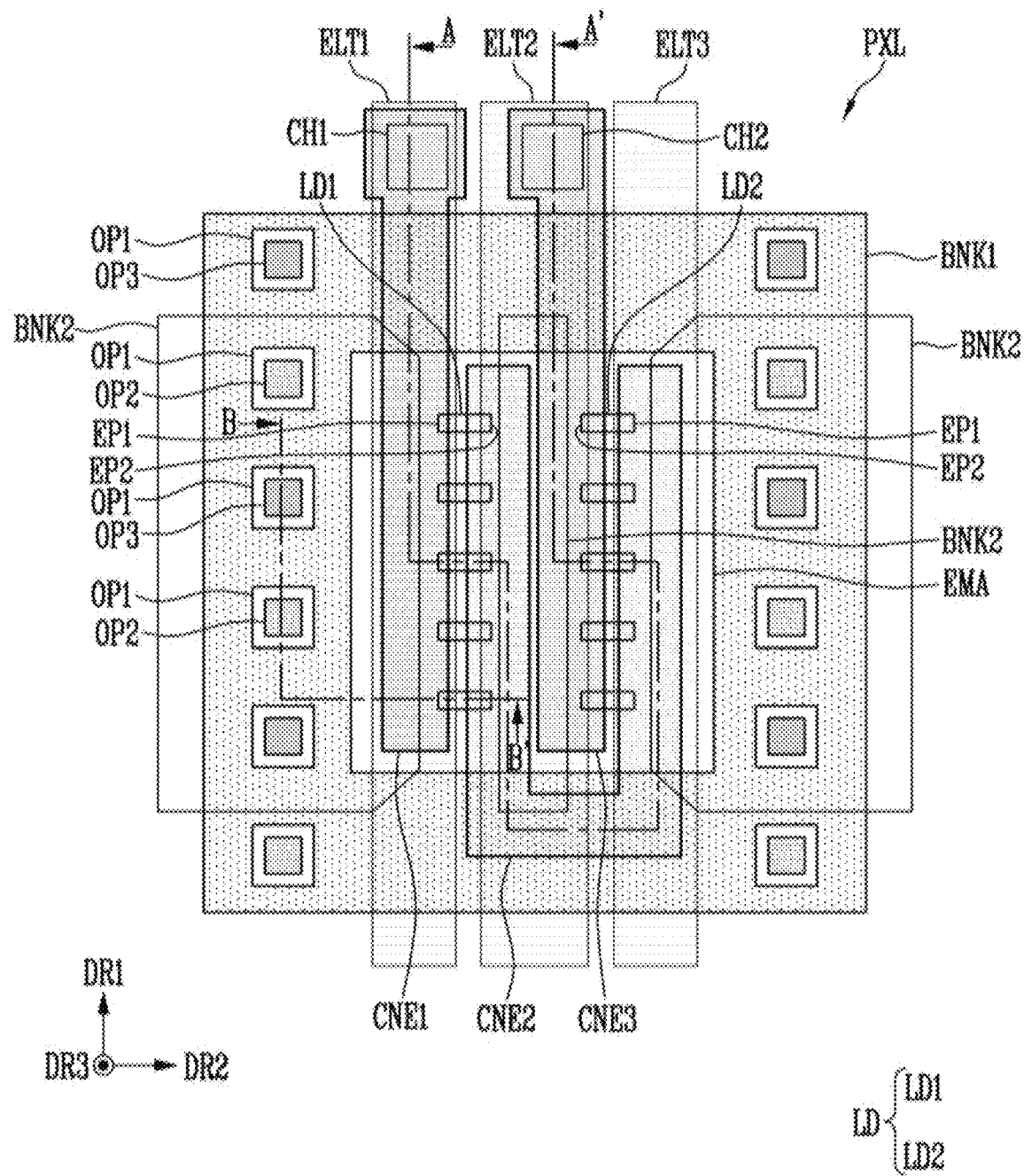
FIG. 5 is a plan diagram schematically illustrating a pixel in accordance with an embodiment of the disclosure.
Figure 6:
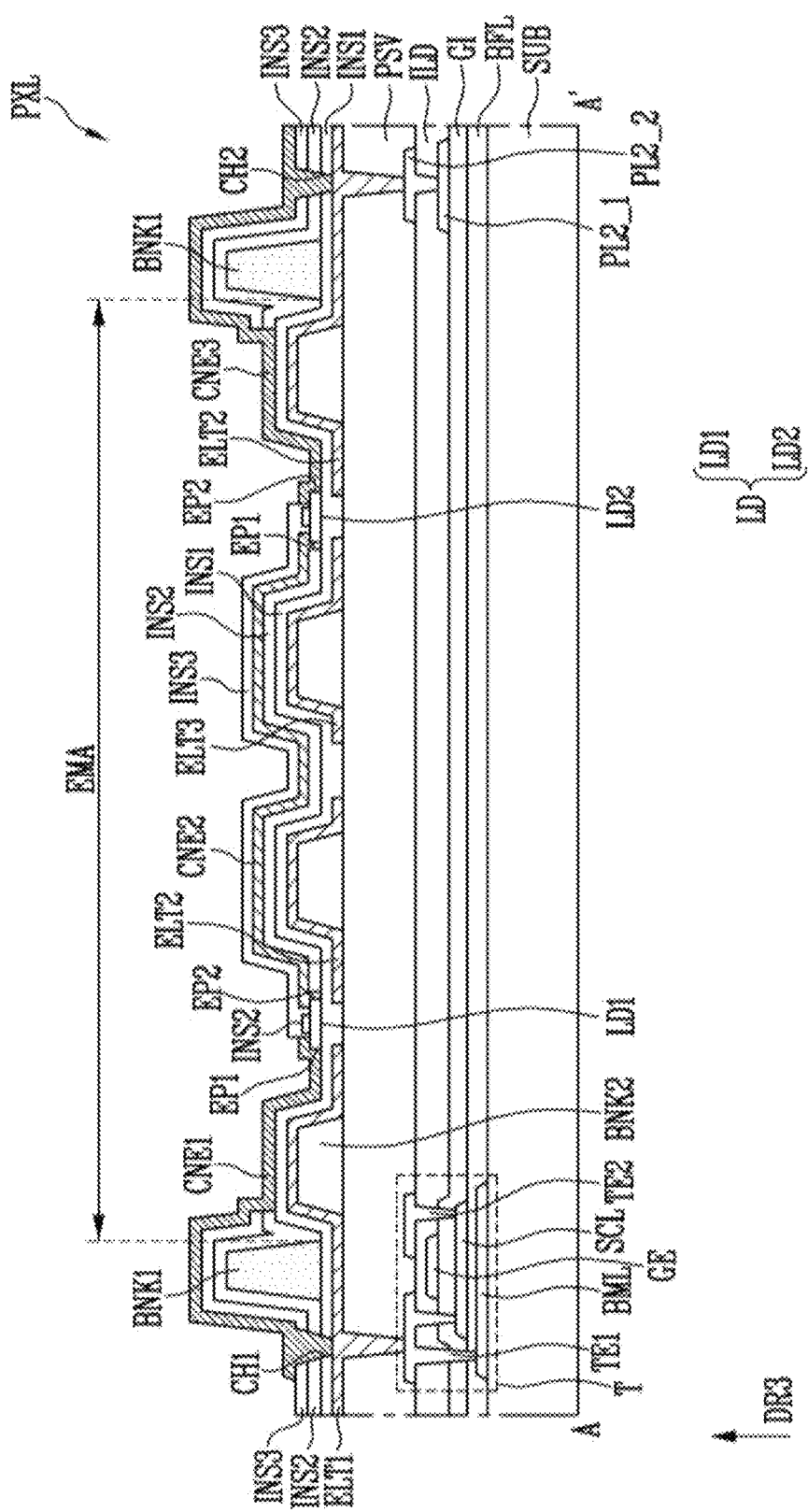
FIG. 6 is a schematic cross-sectional view taken along line A-A' of FIG. 5.
Figure 7:
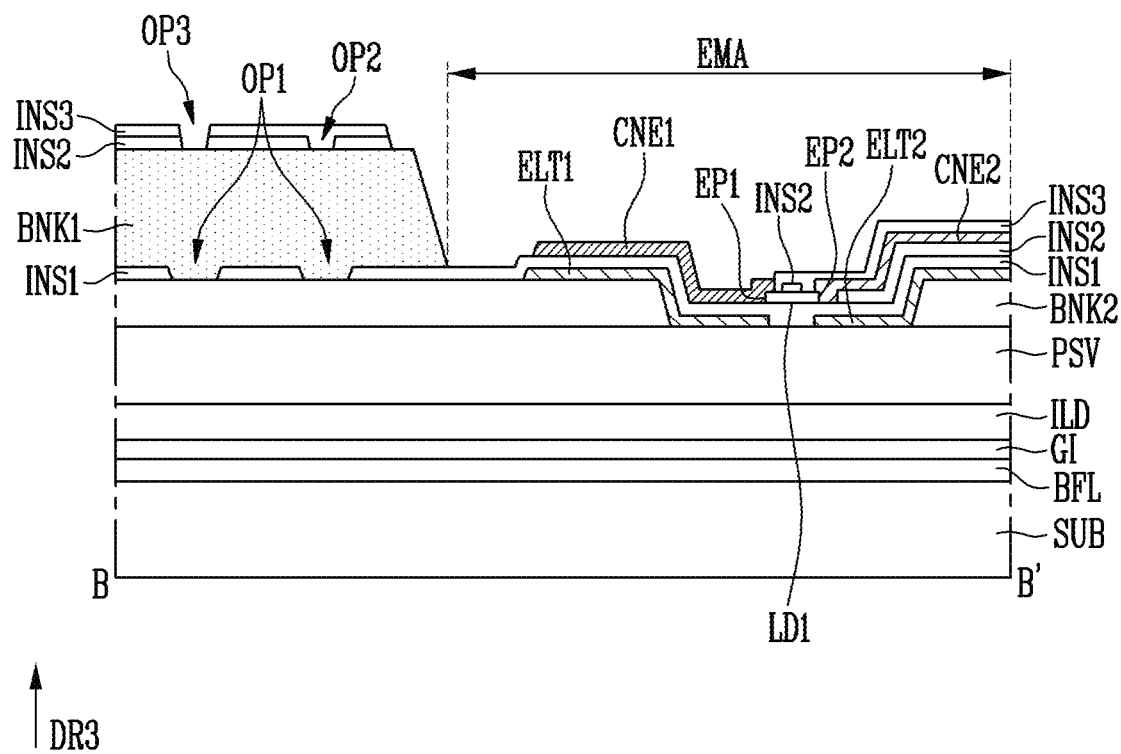
FIG. 7 is a schematic cross-sectional view taken along line B-B' of FIG. 5.

FIG. 5 is a schematic plan view illustrating a pixel in accordance with an embodiment. FIG. 6 is a schematic sectional view taken along line A-A' of FIG. 5. FIG. 7 is a schematic sectional view taken along line B-B' of FIG. 5.

For example, the pixel PXL of FIG. 5 may be one of the first to third pixels PXL1, PXL2, and PXL3 that form the pixel unit PXU of FIG. 3, and the first to third pixels PXL1, PXL2, and PXL3 may have substantially identical or similar structures.

Referring to FIG. 5, the pixel PXL may include a first bank BNK1 which defines each emission area EMA. In other words, the first bank BNK1 may enclose the emission area EMA.

The pixel PXL may include first, second, and third openings OP1, OP2, and OP3 disposed around the emission area EMA. The first to third openings OP1, OP2, and OP3 each may overlap the first bank BNK1.

The first openings OP1 may be spaced apart from each other. For example, as illustrated in FIG. 5, the first openings OP1 may be spaced apart from each other in the first direction DR1. However, the disclosure is not limited thereto, and the arrangement and position of the first openings OP1 may be changed in various ways so long as the first openings OP1 overlap the first bank BNK1. For example, the first openings OP1 may be spaced apart from each other not only in the first direction DR1 but also in various directions.

The second openings OP2 may be spaced apart from each other. For example, as illustrated in FIG. 5, the second openings OP2 may be spaced apart from each other in the first direction DR1. However, the disclosure is not limited thereto, and the arrangement and position of the second openings OP2 may be changed in various ways so long as the second openings OP2 overlap the first bank BNK1. For example, the second openings OP2 may be spaced apart from each other not only in the first direction DR1 but also in various directions.

The second openings OP2 may overlap the first openings OP1. Although FIG. 5 illustrates the case where the entirety of each second opening OP2 overlaps the corresponding first opening OP1, the disclosure is not limited thereto. In other words, each second opening OP2 may partially overlap the corresponding first opening OP1 or may not overlap the first opening OP1. The surface area of the second opening OP2 may differ from that of the first opening OP1. For example, the surface area of the second opening OP2 may be less than that of the first opening OP1, but the disclosure is not limited thereto.

The third openings OP3 may be spaced apart from each other. For example, as illustrated in FIG. 5, the third openings OP3 may be spaced apart from each other in the first direction DR1. However, the disclosure is not limited thereto, and the arrangement and positions of the third openings OP3 may be changed in various ways so long as the third openings OP3 overlap the first bank BNK1. For example, the third openings OP3 may be spaced apart from each other not only in the first direction DR1 but also in various directions.

The third openings OP3 may overlap the first openings OP1. Although FIG. 5 illustrates the case where the entirety of each third opening OP3 overlaps the corresponding first opening OP1, the disclosure is not limited thereto. In other words, each third opening OP3 may partially overlap the corresponding first opening OP1 or may not overlap the first opening OP1. The surface area of the third opening OP3 may differ from that of the first opening OP1. For example, the surface area of the third opening OP3 may be less than that of the first opening OP1, but the disclosure is not limited thereto. Furthermore, the surface area of the third opening OP3 and the second opening OP2 may be substantially the same as that of the second opening OP2, but the disclosure is not limited thereto.

The second openings OP2 and the third openings OP3 may be alternately disposed. In other words, each second opening OP2 may be disposed between adjacent third openings OP3, and each third opening OP3 may be disposed between adjacent second openings OP2. For example, as illustrated in FIG. 5, the second openings OP2 and the third openings OP3 may be disposed alternately in the first direction DR1. However, the disclosure is not limited thereto, and the arrangements of the second openings OP2 and the third openings OP3 may be changed in various ways. For example, the second openings OP2 and the third openings OP3 may be disposed alternately with each other not only in the first direction DR1 but also in various directions. As another example, the second openings OP2 may be successively disposed, and the third openings OP3 may be successively disposed.

As described above, in case that the first to third openings OP1, OP2, and OP3 are formed around the emission area EMA of each pixel PXL, outgas generated during a process of fabricating the display device may be discharged outward through the first to third openings OP1, OP2, and OP3, so that defects attributable to the outgas can be prevented. Detailed descriptions thereof will be made with reference to FIG. 7.

First to third electrodes ELT1, ELT2, and ELT3, first and second light emitting elements LD1 and LD2, and first to third connection electrodes CNE1, CNE2, and CNE3 may be disposed in the emission area EMA of the pixel PXL.

Each of the first to third electrodes ELT1, ELT2, and ELT3 may extend in the first direction DR1 and be spaced apart from each other in the second direction DR2. The first to third electrodes ELT1, ELT2, and ELT3 may be successively arranged in the second direction DR2. However, the disclosure is not limited to this, and the shapes and/or relative disposition relationship of the first to third electrodes ELT1, ELT2, and ELT3 may be changed in various ways.

The first to third electrodes ELT1, ELT2, and ELT3 may be supplied with alignment signals (or alignment voltages) in the step of aligning the light emitting elements LD. Therefore, an electric field may be formed between the first to third electrodes ELT1, ELT2, and ELT3, so that the light emitting elements LD supplied to the emission area EMA may be aligned between the first to third electrodes ELT1, ELT2, and ELT3. After the alignment of the light emitting elements LD has been completed, the first to third electrodes ELT1, ELT2, and ELT3 are electrically disconnected from each other on the boundary between the pixels PXL so that the pixels PXL can be individually driven.

The first electrode ELT1 may be electrically connected with the first transistor T1 described with reference to FIG. 4 or the like. The second electrode ELT2 may be electrically connected with the second power supply VSS (or the second power line PL2) described with reference to FIG. 4 or the like. The first electrode ELT1, the second electrode ELT2, and/or the third electrode ELT3 may partially overlap the first bank BNK1. In an embodiment, the first to third electrodes ELT1, ELT2, and ELT3 may partially extend to the perimeter of the emission area EMA. In other words, before the light emitting elements LD are supplied to the emission area EMA, the first to third electrodes ELT1, ELT2, and ELT3 may extend to adjacent pixels PXL. After the light emitting elements LD are supplied to and aligned in the emission area EMA, the first to third electrodes ELT1, ELT2, and ELT3 may be cut off (or partially removed) around the first bank BNK1.

Light emitting elements LD may be disposed between the first to third electrodes ELT1, ELT2, and ELT3. The first light emitting element LD1 may be disposed between the first electrode ELT1 and the second electrode ELT2. The second light emitting element LD2 may be disposed between the second electrode ELT2 and the third electrode ELT3. The light emitting elements LD may be aligned between the first to third electrodes ELT1, ELT2, and ELT3 to have directionality. For example, respective first ends EP1 of the first light emitting elements LD1 may face the first electrode ELT1. Respective second ends EP2 of the first light emitting elements LD1 may face the second electrode ELT2. Furthermore, respective first ends EP1 of the second light emitting elements LD2 may face the second electrode ELT2. Respective second ends EP2 of the second light emitting elements LD2 may face the third electrode ELT3.

In an embodiment, the light emitting elements LD may be prepared in a diffused form in a predetermined solution and may be supplied to the emission area EMA by an inkjet printing method, a slit coating method, or the like. For example, the light emitting elements LD may be mixed with a volatile solvent and supplied to the emission area EMA. Here, if a predetermined voltage is applied between the first to third electrodes ELT1, ELT2, and ELT3, an electric field may be formed between the first to third electrodes ELT1, ELT2, and ELT3 so that the light emitting elements LD can be aligned between the first to third electrodes ELT1, ELT2, and ELT3. After the light emitting elements LD have been aligned, the solvent may be removed by a volatilization method or other methods. In this way, the light emitting elements LD may be reliably arranged between the first to third electrodes ELT1, ELT2, and ELT3.

The light emitting elements LD may be electrically connected to the first and second electrodes ELT1 and ELT2 through the first to third connection electrodes CNE1, CNE2, and CNE3. The first connection electrode CNE1 may be provided on the first electrode ELT1 and the respective first ends of the first light emitting elements LD1. The first connection electrode CNE1 may electrically contact the first electrode ELT1 and the respective first ends of the first light emitting elements LD1. In other words, the first connection electrode CNE1 may electrically connect the first electrode ELT1 and the first light emitting elements LD1. The first connection electrode CNE1 may extend to the perimeter of the first bank BNK1 and be electrically connected with the first electrode ELT1. For example, the first connection electrode CNE1 may extend to the perimeter of the first bank BNK1 and electrically contact the first electrode ELT1 through a first contact hole CH1. In an embodiment, the first connection electrode CNE1 may extend in the first direction DR1. The shape and/or disposition of the first connection electrode CNE1 may be changed in various ways.

The second connection electrode CNE2 may be disposed on the second ends EP2 of the first light emitting elements LD1 and the first ends EP1 of the second light emitting elements LD2. The second connection electrode CNE2 may electrically contact the second ends EP2 of the first light emitting elements LD1 and the first ends EP1 of the second light emitting elements LD2. The second connection electrode CNE2 may electrically connect the second ends EP2 of the first light emitting elements LD1 with the first ends EP1 of the second light emitting elements LD2. In an embodiment, the second connection electrode CNE2 may overlap the second electrode ELT2 and/or the third electrode ELT3, but the disclosure is not limited thereto. In an embodiment, the second connection electrode CNE2 may be spaced apart from the first connection electrode CNE1 and the third connection electrode CNE3. For example, the second connection electrode CNE2 may extend from the second ends EP2 of the first light emitting elements LD1, bypass the third connection electrode CNE3, and extend to the first ends EP1 of the second light emitting elements LD2. In other words, the second connection electrode CNE2 may have a shape partially enclosing the third connection electrode CNE3. The second connection electrode CNE2 may have an overall closed-loop shape and have a shape in which a portion thereof is cut off or open. Here, the shape and/or disposition of the second connection electrode CNE2 may be changed in various ways.

The third connection electrode CNE3 may be provided on the second ends EP2 of the second light emitting elements LD2 and the second electrode ELT2. The third connection electrode CNE3 may electrically contact the second ends EP2 of the second light emitting elements LD2 and the second electrode ELT2. The third connection electrode CNE3 may electrically connect the second ends EP2 of the second light emitting elements LD2 with the second electrode ELT2. The third connection electrode CNE3 may extend to the perimeter of the first bank BNK1 and be electrically connected with the second electrode ELT2. For example, the third connection electrode CNE3 may extend to the perimeter of the first bank BNK1 and electrically contact the second electrode ELT2 through a second contact hole CH2. In an embodiment, the third connection electrode CNE3 may extend in the first direction DR1. Here, the shape and/or disposition of the third connection electrode CNE3 may be changed in various ways.

In this way, the first and second light emitting elements LD1 and LD2 may be electrically connected in series between the first electrode ELT1 and the second electrode ELT2 by the first to third connection electrodes CNE1, CNE2, and CNE3. However, the disclosure is not limited thereto. The light emitting elements LD may be directly electrically connected to the first to third electrodes ELT1, ELT2, and ELT3, so that separate connection electrodes may be omitted.

In an embodiment, the pixel PXL may include second banks BNK2 which overlap the first electrode ELT1, the second electrode ELT2, or the third electrode ELT3. The second banks BNK2 may be disposed in the emission area EMA at positions spaced apart from each other and each may protrude such that an area of a corresponding one of the first electrode ELT1, the second electrode ELT2, and the third electrode ELT3 may protrude upward, for example, in the third direction DR3. Although FIG. 5 illustrates the case where the second banks BNK2 are disposed not only in the emission area EMA but also on the boundary of the pixel PXL, the disclosure is not limited thereto. In an embodiment, each second bank BNK2 may be partially disposed only in the emission area EMA.

Hereinafter, the sectional structure of each pixel PXL will be described in detail based on the light emitting element LD, with reference to FIGS. 6 and 7. FIG. 6 illustrates a transistor T (e.g., the first transistor T1 of FIG. 4 or the like) electrically connected to the first electrode ELT1 among various circuit elements that form the pixel circuit PXC. Hereinafter, in case that there is no need to separately designate the first transistor T1, the term "transistor T" may be used to comprehensively designate the first transistor T1. The structures of the transistors T and/or positions in layers thereof are not limited to those of the embodiment shown in FIG. 6 and may be changed in various ways depending on embodiments. The transistors T that form each pixel circuit PXC may have a substantially identical or similar structures, but the disclosure is not limited thereto. For example, in an embodiment, at least one of the transistors T that form the pixel circuit PXC may have a sectional structure different from that of the other transistors T, and/or be disposed on a layer different from that of the other transistors T.

Referring to FIGS. 6 and 7, the pixel PXL and the display device including the pixel PXL may include a substrate SUB, transistors T, first to third electrodes ELT1, ELT2, and ELT3, light emitting elements LD, and first to third connection electrodes CNE1, CNE2, and CNE3.

The substrate SUB may form a base and be formed of a rigid or flexible substrate or film. For example, the substrate SUB may be a rigid substrate made of glass or reinforced glass, a flexible substrate (or a thin film) formed of plastic or metal, or at least one insulating layer. The material and/or properties of the substrate SUB is not particularly limited. In an embodiment, the substrate SUB may be substantially transparent. Here, the phrase "substantially transparent" may mean that light can pass through the substrate SUB at a predetermined transmissivity or more. In an embodiment, the substrate SUB may be translucent or opaque. Furthermore, the substrate SUB may include a reflective material in some embodiments.

Each transistor T may include a lower conductive layer BML, a semiconductor pattern SCL, a gate electrode GE, and first and second transistor electrodes TE1 and TE2. Although FIG. 6 illustrates an embodiment where the transistor T includes first and second transistor electrodes TE1 and TE2 which are formed separately from the semiconductor pattern SCL, the disclosure is not limited thereto. For example, in an embodiment, the first and/or second transistor electrode TE1 and/or TE2 provided in at least one transistor T may be integral with the corresponding semiconductor pattern SCL.

The lower conductive layer BML may be disposed on the substrate SUB. The lower conductive layer BML may have a single layer or multi-layer structure formed of at least one of molybdenum (Mo), aluminum (Al), chromium (Cr), gold (Au), titanium (Ti), nickel (Ni), neodymium (Nd), and copper (Cu), or an alloy thereof.

A buffer layer BFL may be disposed on the lower conductive layer BML. The buffer layer BFL may prevent impurities from diffusing into each circuit element. The buffer layer BFL may be formed of a single layer or may be formed of multiple layers having at least two or more layers. In case that the buffer layer BFL has a multi-layer structure, the respective layers may be formed of a same material or different materials.

The semiconductor pattern SCL may be disposed on the buffer layer BFL. For example, the semiconductor pattern SCL may include a first area which contacts each first transistor electrode TE1, a second area which contacts each second transistor electrode TE2, and a channel area disposed between the first and second areas. In an embodiment, one of the first and second areas may be a source area, and the other may be a drain area.

In an embodiment, the semiconductor pattern SCL may be formed of polysilicon, amorphous silicon, an oxide semiconductor, or the like. The channel area of the semiconductor pattern SCL may be an intrinsic semiconductor, which is an undoped semiconductor pattern. Each of the first and second areas of the semiconductor pattern SCL may be a semiconductor doped with a predetermined impurity.

A gate insulating layer GI may be disposed on the semiconductor pattern SCL. For example, the gate insulating layer GI may be disposed between the semiconductor pattern SCL and the gate electrode GE. The gate insulating layer GI may be formed of a single layer or multiple layers and include various inorganic materials including silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), and titanium oxide ($TiO_x$).

The gate electrode GE and/or a lower power line PL2_1 may be disposed on the gate insulating layer GI. The gate electrode GE may be disposed on the gate insulating layer GI to overlap the semiconductor pattern SCL in the third direction DR3. The lower power line PL2_1 may form the second power line PL2 described with reference to FIG. 4, etc. The gate electrode GE and the lower power line PL2_1 may be formed of the same conductive layer. In other words, the gate electrode GE and the lower power line PL2_1 may be simultaneously formed by a same process, but the disclosure is not limited thereto.

An interlayer insulating layer ILD may be disposed on the gate electrode GE and/or the lower power line PL2_1. For example, the interlayer insulating layer ILD may be disposed between the gate electrode GE and the first and second transistor electrodes TE1 and TE2. The interlayer insulating layer ILD may be formed of a single layer or multiple layers and include various inorganic materials including silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), and titanium oxide ($TiO_x$).

The first and second transistor electrodes TE1 and TE2 and/or an upper power line PL2_2 may be disposed on the interlayer insulating layer ILD. The first and second transistor electrodes TE1 and TE2 may overlap the semiconductor pattern SCL in the third direction DR3. The first and second transistor electrodes TE1 and TE2 may be electrically connected to the semiconductor pattern SCL. For example, the first transistor electrode TE1 may be electrically connected with the first area of the semiconductor pattern SCL through a contact hole passing through the interlayer insulating layer ILD and the gate insulating layer GI. The first transistor electrode TE1 may be electrically connected with the lower conductive layer BML, through a contact hole passing through the interlayer insulating layer ILD, the gate insulating layer GI, and the buffer layer BFL. The second transistor electrode TE2 may be electrically connected with the second area of the semiconductor pattern SCL through a contact hole passing through the interlayer insulating layer ILD and the gate insulating layer GI. In an embodiment, one of the first and second transistor electrodes TE1 and TE2 may be a source electrode, and the other may be a drain electrode.

The upper power line PL2_2 and the lower power line PL2_1 may overlap each other in the third direction DR3. The upper power line PL2_2 may be electrically connected with the lower power line PL2_1 through a contact hole passing through the interlayer insulating layer ILD. The upper power line PL2_2 along with the lower power line PL2_1 may form the second power line PL2 described with reference to FIG. 4 or the like.

The first and second transistor electrodes TE1 and TE2 and the upper power line PL2_2 may be formed of the same conductive layer. In other words, the first and second transistor electrodes TE1 and TE2 and the upper power line PL2_2 may be simultaneously formed by a same process, but the disclosure is not limited thereto.

A passivation layer PSV may be disposed over the circuit elements including the transistors T. The passivation layer PSV may be formed of an organic material for planarizing a stepped structure provided therebelow. For example, the passivation layer PSV may include an organic insulating material such as acrylates resin, epoxy resin, phenolic resin, polyamides resin, polyimides resin, unsaturated polyesters resin, polyphenylene sulfides resin, or benzocyclobutene (BCB). However, the disclosure is not limited thereto. The passivation layer PSV may include various inorganic materials including silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), and titanium oxide ($TiO_x$).

The second bank BNK2 may be disposed on the passivation layer PSV. The second bank BNK2 may be formed of a separate or integral pattern. The second bank BNK2 may have various shapes depending on embodiments. In an embodiment, the second bank BNK2 may have a shape protruding in the third direction DR3 on the substrate SUB. Furthermore, the second bank BNK2 may have an inclined surface angled with respect to the substrate SUB at a predetermined angle. However, the disclosure is not limited thereto. The second bank BNK2 may have a sidewall having a curved or stepped shape. For example, the second bank BNK2 may have a semi-circular or semi-elliptical cross-section.

The electrodes and the insulating layers that are disposed over the second bank BNK2 may have shapes corresponding to that of the second bank BNK2. For example, the first to third electrodes ELT1, ELT2, and ELT3 disposed on the second bank BNK2 each may have an inclined surface or a curved surface having a shape corresponding to that of the second bank BNK2. Therefore, the second bank BNK2 along with the first to third electrodes ELT1, ELT2, and ELT3 provided thereon may function as a reflector for guiding light emitted from the light emitting elements LD in the frontal direction of the pixel PXL, for example, in the third direction DR3, thereby enhancing the light output efficiency.

The second bank BNK2 may include at least one organic material and/or inorganic material. For example, the second bank BNK2 may include an organic material such as acrylates resin, epoxy resin, phenolic resin, polyamides resin, polyimides resin, unsaturated polyesters resin, polyphenylene sulfides resin, or benzocyclobutene (BCB). However, the disclosure is not limited thereto. The second bank BNK2 may include various inorganic materials including silicon oxide ($SiO_x$), silicon nitride ($SiN_x$), silicon oxynitride ($SiO_xN_y$), aluminum nitride ($AlN_x$). aluminum oxide ($AlO_x$), zirconium oxide ($ZrO_x$), hafnium oxide ($HfO_x$), and titanium oxide ($TiO_x$).

The first to third electrodes ELT1, ETL2, and ELT3 may be disposed on the second bank BNK2. The first to third electrodes ELT1, ELT2, and ELT3 may be spaced apart from each other. The first to third electrodes ELT1, ELT2, and ELT3 may be supplied with alignment signals (or alignment voltages) in the step of aligning the light emitting elements LD. Therefore, an electric field may be formed between the first to third electrodes ELT1, ELT2, and ELT3, so that the light emitting elements LD supplied to the emission area EMA may be aligned between the first to third electrodes ELT1, ELT2, and ELT3.

The first electrode ELT1 may be electrically connected with the first transistor electrode TE1 through a contact hole passing through the passivation layer PSV. The second electrode ELT2 may be electrically connected with the upper power line PL2_2 through a contact hole passing through the passivation layer PSV, and electrically connected with the lower power line PL2_1.

Each of the first to third electrodes ELT1, ELT2, and ELT3 may include at least one conductive material. For example, the first to third electrodes ELT1, ELT2, and ELT3 may include at least one conductive material among at least one of various metal materials including silver (Ag), magnesium (Mg), aluminum (Al), platinum (Pt), palladium (Pd), gold (Au), nickel (Ni), neodymium (Nd), iridium (Ir), chromium (Cr), titanium (Ti), molybdenum (Mo), copper (Cu), or the like, or an alloy thereof, a conductive oxide such as indium tin oxide (ITO), indium zinc oxide (IZO), indium tin zinc oxide (ITZO), zinc oxide (ZnO), aluminum zinc oxide (AZO), gallium zinc oxide (GZO), zinc tin oxide (ZTO), gallium tin oxide (GTO), or fluorine tin oxide (FTO), and a conductive polymer such as poly(3,4-ethylenedioxythiophene) (PEDOT), but the disclosure is not limited thereto.

A first insulating layer INS1 may be disposed on the first to third electrodes ELT1, ELT2, and ELT3. The first insulating layer INS1 may be formed as a single layer or multiple layers and include various inorganic materials including silicon oxide ($SiO_x$), silicon nitride ($SiN_x$), silicon oxynitride ($SiO_xN_y$), aluminum nitride ($AlN_x$). aluminum oxide ($AlO_x$), zirconium oxide ($ZrO_x$), hafnium oxide ($HfO_x$), and titanium oxide ($TiO_x$).

The first opening OP1 may pass through the first insulating layer INS1. The first opening OP1 may pass through the first insulating layer INS1 and expose the second bank BNK2 disposed thereunder. Even if during a process of fabricating the display device, outgas is generated from the passivation layer PSV and/or the second bank BNK2 that is formed of an organic material, the outgas can be discharged outward through the first opening OP1 formed in the first insulating layer INS1. Therefore, defects attributable to the outgas may be minimized.

The first conductive layer BNK1 may be disposed on the first insulating layer INS1. The first bank BNK1 may be disposed on the perimeter of the pixel PXL to define the emission area EMA. The first bank BNK1 may overlap the first opening OP1 in the third direction DR3. The first bank BNK1 may contact the second bank BNK2 exposed by the first opening OP1.

The first bank BNK1 may include an organic material such as acrylates resin, epoxy resin, phenolic resin, polyamides resin, polyimides resin, unsaturated polyesters resin, polyphenylene sulfides resin, or benzocyclobutene (BCB). However, the disclosure is not limited thereto. The first bank BNK1 may include various inorganic materials including silicon oxide ($SiO_x$), silicon nitride ($SiN_x$), silicon oxynitride ($SiO_xN_y$), aluminum nitride ($AlN_x$). aluminum oxide ($AlO_x$), zirconium oxide ($ZrO_x$), hafnium oxide ($HfO_x$), and titanium oxide ($TiO_x$).

The light emitting elements LD may be disposed in the emission area EMA defined by the first bank BNK1. The light emitting elements LD may be disposed on the first insulating layer INS1 between the first to third electrodes ELT1, ELT2, and ELT3. The first light emitting elements LD1 may be disposed between the first electrode ELT1 and the second electrode ELT2. The second light emitting elements LD2 may be disposed between the second electrode ELT2 and the third electrode ELT3.

The light emitting elements LD may be prepared in a diffused form in a predetermined solution and may be supplied to the emission area EMA of each pixel PXL by an inkjet printing method or the like. For example, the light emitting elements LD may be diffused in a volatile solvent and supplied to each emission area EMA. Here, if a predetermined voltage (or an alignment voltage) is supplied through the first to third electrodes ELT1, ELT2, and ELT3 of each pixel PXL, an electric field may be formed between the first to third electrodes ELT1, ELT2, and ELT3 so that the light emitting elements LD can be aligned between the first to third electrodes ELT1, ELT2, and ELT3. After the light emitting elements LD have been aligned, the solvent may be removed by a volatilization method or other methods. In this way, the light emitting elements LD may be reliably arranged between the first to third electrodes ELT1, ELT2, and ELT3.

A second insulating layer INS2 may be disposed on the first insulating layer INS1, the first bank BNK1, and/or the light emitting elements LD. The second insulating layer INS2 may be partially disposed on the first insulating layer INS1, the first bank BNK1, and/or the light emitting elements LD. For example, the second insulating layer INS2 may at least partially cover (or overlap) the first bank BNK1. The second insulating layer INS2 may be disposed directly on the first bank BNK1.

The second opening OP2 may pass through the second insulating layer INS2. The second opening OP2 may overlap the first bank BNK1 in the third direction DR3. Furthermore, the second opening OP2 may overlap the first opening OP1 in the third direction DR3, but the disclosure is not limited thereto.

The second opening OP2 may pass through the second insulating layer INS2 and expose the first bank BNK1 disposed thereunder. Even if during the process of fabricating the display device outgas is generated from the passivation layer PSV and/or the second bank BNK2 that is formed of organic material, the outgas can be discharged outward through the second opening OP2 formed in the second insulating layer INS2. Therefore, defects attributable to the outgas may be reduced or minimized.

Furthermore, the second insulating layer INS2 may be disposed on the light emitting elements LD such that the first and second ends EP1 and EP2 of the light emitting elements LD are exposed from the second insulating layer INS2. In case that the second insulating layer INS2 is formed on the light emitting elements LD after the alignment of the light emitting elements LD has been completed, the light emitting elements LD may be prevented from being removed from the aligned positions.

The second insulating layer INS2 may be formed of a single layer or multiple layers and include various inorganic materials including silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), and titanium oxide ($TiO_x$).

The first to third connection electrodes CNE1, CNE2, and CNE3 may be disposed on the first and second ends EP1 and EP2 of the light emitting elements LD that are exposed by the second insulating layer INS2. For example, the first connection electrode CNE1 may be disposed on the first ends EP1 of the first light emitting elements LD1. The first connection electrode CNE1 may electrically contact the first ends EP1 of the first light emitting elements LD1 that are exposed from the second insulating layer INS2. The first connection electrode CNE1 may be disposed on the first electrode ELT1. The first connection electrode CNE1 may extend to the perimeter of the first bank BNK1 and electrically contact the first electrode ELT1 through the first contact hole CH1 passing through the first to third insulating layers INS1, INS2, and INS3. In other words, the first connection electrode CNE1 may electrically connect the first electrode ELT1 and the first light emitting elements LD1.

The second connection electrode CNE2 may be disposed on the second ends EP2 of the first light emitting elements LD1. The second connection electrode CNE1 may electrically contact the second ends EP2 of the first light emitting elements LD1 that are exposed from the second insulating layer INS2. Furthermore, the second connection electrode CNE2 may be provided on the first ends EP1 of the second light emitting elements LD2. The second connection electrode CNE2 may electrically contact the first ends EP1 of the second light emitting elements LD2 that are exposed from the second insulating layer INS2. The second connection electrode CNE2 may electrically connect the second ends EP2 of the first light emitting elements LD1 with the first ends EP1 of the second light emitting elements LD2. In an embodiment, the second connection electrode CNE2 may overlap the second electrode ELT2 and/or the third electrode ELT3 in the third direction DR3, but the disclosure is not limited thereto.

The third connection electrode CNE3 may be disposed on the second ends EP2 of the second light emitting elements LD2. The third connection electrode CNE3 may electrically contact the second ends EP2 of the second light emitting elements LD2 that are exposed from the second insulating layer INS2. The third connection electrode CNE3 may be disposed on the second electrode ELT2. The third connection electrode CNE3 may extend to the perimeter of the first bank BNK1 and electrically contact the second electrode ELT2 through the second contact hole CH2 passing through the first to third insulating layers INS1, INS2, and INS3. In other words, the third connection electrode CNE3 may electrically connect the second electrode ELT2 and the second light emitting elements LD2. Therefore, the first and second light emitting elements LD1 and LD2 may be electrically connected in series between the first electrode ELT1 and the second electrode ELT2.

In an embodiment, the first to third connection electrodes CNE1, CNE2, and CNE3 may be formed of different conductive layers. For example, as illustrated in FIG. 6, after the second connection electrode CNE2 is disposed on the second insulating layer INS2, and the third insulating layer INS3 is formed to cover (or overlap) the second connection electrode CNE2, the first connection electrode CNE1 and/or the third connection electrode CNE3 may be disposed on the third insulating layer INS3. The first connection electrode CNE1 and the third connection electrode CNE3 may be formed of the same conductive layer. In other words, the first connection electrode CNE1 and the third connection electrode CNE3 may be simultaneously formed by a same process, but the disclosure is not limited thereto.

A sequence in which the first to third connection electrodes CNE1, CNE2, and CNE3 are formed may be changed depending on embodiments. In other words, after the first connection electrode CNE1 and the third connection electrode CNE3 are first formed, and the third insulating layer INS3 is formed to cover (or overlap) the first connection electrode CNE1 and the third connection electrode CNE3, the second connection electrode CNE2 may be formed on the third insulating layer INS3. The first to third connection electrodes CNE1, CNE2, and CNE3 may be simultaneously formed by a same process.

The first to third connection electrodes CNE1, CNE2, and CNE3 may be formed of various transparent conductive materials. For example, the first to third connection electrodes CNE1, CNE2, and CNE3 may include at least one of various transparent conductive materials including indium tin oxide (ITO), indium zinc oxide (IZO), indium tin zinc oxide (ITZO), zinc oxide (ZnO), aluminum zinc oxide (AZO), gallium zinc oxide (GZO), zinc tin oxide (ZTO), gallium tin oxide (GTO), and fluorine tin oxide (FTO) and may be transparently or translucently formed to satisfy a predetermined transmittance. Therefore, light emitted from the first and second ends EP1 and EP2 of the light emitting elements LD may pass through the first to third connection electrodes CNE1, CNE2, and CNE3 and be emitted outside the display panel PNL.

The third insulating layer INS3 may be disposed between the first to third connection electrodes CNE1, CNE2, and CNE3 that are formed of different conductive layers. For example, as illustrated in FIG. 6, the third insulating layer INS3 may be disposed on the second connection electrode CNE2. The third insulating layer INS3 may cover (or overlap) the second connection electrode CNE2 and expose the first ends EP1 of the first emitting elements LD1 and the second ends EP2 of the second emitting elements LD2. The first connection electrode CNE1 may be disposed on the first ends EP1 of the first light emitting elements LD1 that are exposed from the third insulating layer INS3. The third connection electrode CNE3 may be disposed on the second ends EP2 of the second light emitting elements LD2 that are exposed from the third insulating layer INS3. As described above, in case that the third insulating layer INS3 is disposed between the first to third connection electrodes CNE1, CNE2, and CNE3 that are formed of different conductive layers, the first to third connection electrodes CNE1, CNE2, and CNE3 may be reliably separated from each other by the third insulating layer INS3, so that electrical stability between the first and second ends EP1 and EP2 of the light emitting elements LD can be secured. Therefore, a short circuit defect between the first and second ends EP1 and EP2 of the light emitting elements LD may be effectively prevented from occurring.

Furthermore, the third insulating layer INS3 may be disposed on the second insulating layer INS2 that covers the first bank BNK1. The third insulating layer INS3 may be disposed directly on the second insulating layer INS2.

The third opening OP3 may pass through the third insulating layer INS3. In an embodiment, the third opening OP3 may pass not only through the third insulating layer INS3 but also through the second insulating layer INS2 disposed thereunder. The third opening OP3 of the third insulating layer INS3 and the third opening OP3 of the second insulating layer INS2 may be simultaneously formed by a same etching process, but the disclosure is not limited thereto.

The third opening OP3 may overlap the first bank BNK1 in the third direction DR3. Furthermore, the third opening OP3 may overlap the first opening OP1 in the third direction DR3, but the disclosure is not limited thereto.

The third opening OP3 may pass through the third insulating layer INS3 and/or the second insulating layer INS2 and expose the first bank BNK1 disposed thereunder. Even if during the process of fabricating the display device outgas is generated from the passivation layer PSV and/or the second bank BNK2 that is formed of an organic material, the outgas can be discharged outward through the third opening OP3 formed in the third insulating layer INS3 and/or the second insulating layer INS2. Therefore, defects attributable to the outgas may be minimized.

The third insulating layer INS3 may be formed of a single layer or multiple layers and include various inorganic materials including silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), and titanium oxide ($TiO_x$).

In the display device in accordance with the foregoing embodiment, even if during a process of fabricating the display device, outgas is generated from the passivation layer PSV and/or the second bank BNK2 that is formed of an organic material, the outgas can be discharged outward through the first to third openings OP1, OP2, and OP3 formed around the emission area EMA. Therefore, defects attributable to the outgas may be minimized.

Hereinafter, another embodiment will be described. In descriptions of the following embodiment, like reference numerals will be used to designate components identical to those described above, and repetitive descriptions thereof will be omitted or simplified.

Figure 8:
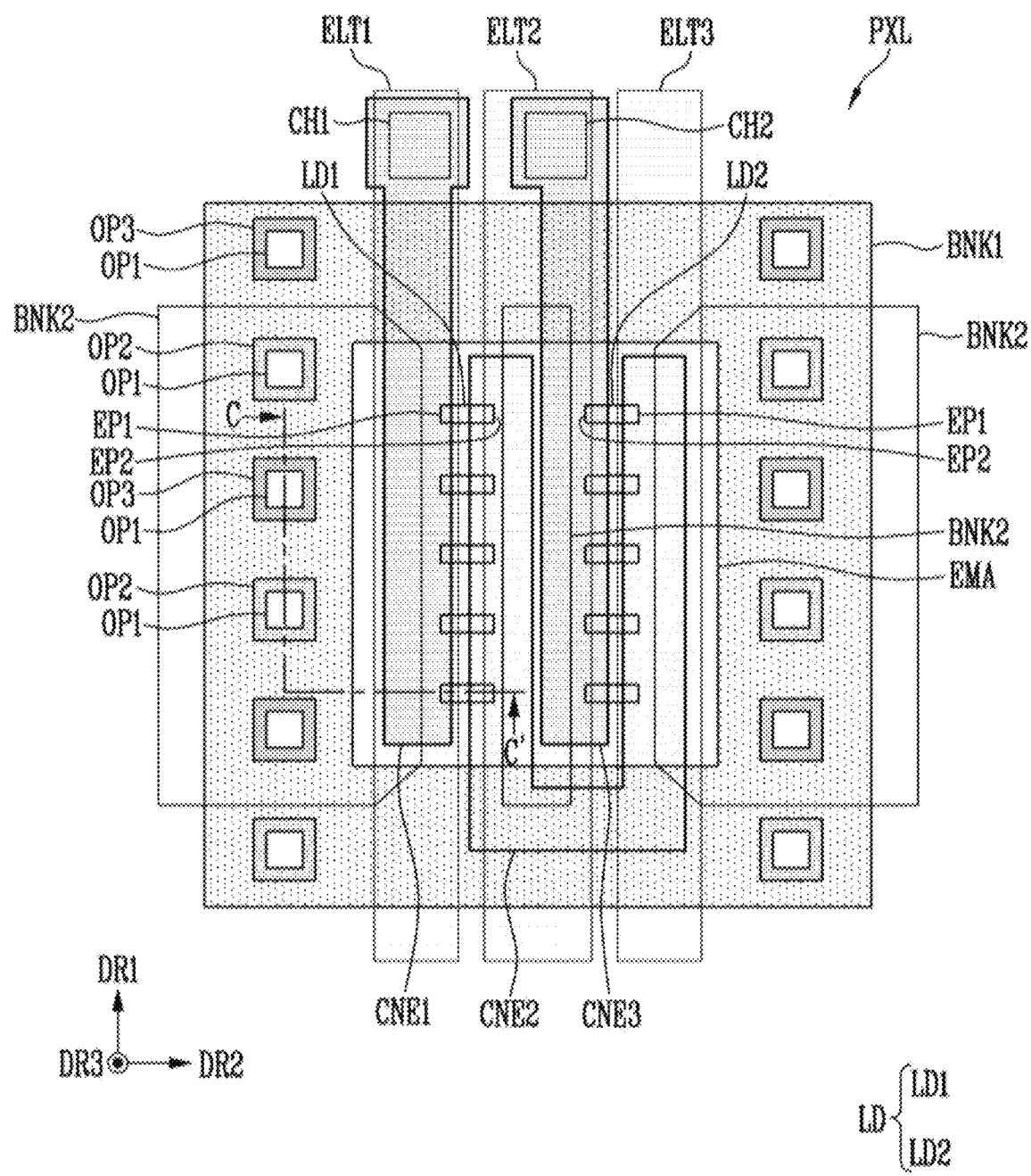
FIG. 8 is a plan view schematically illustrating a pixel in accordance with an embodiment.
Figure 9:
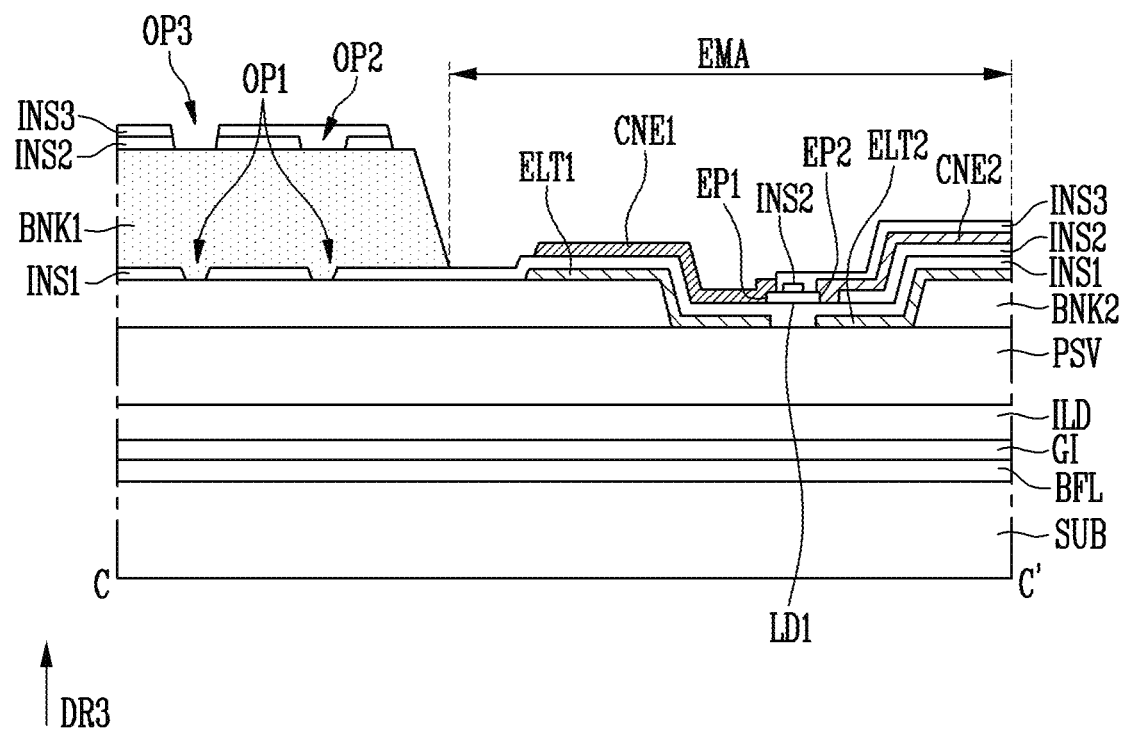
FIG. 9 is a schematic cross-sectional view taken along line C-C' of FIG. 8.

FIG. 8 is a schematic plan view illustrating a pixel in accordance with an embodiment. FIG. 9 is a schematic sectional view taken along line C-C' of FIG. 8.

Referring to FIGS. 8 and 9, this embodiment differs from the embodiments of FIGS. 1 to 7 at least in that the entirety of each first opening OP1 overlaps a corresponding second opening OP2 and/or third opening OP3.

In detail, the first opening OP1 may completely overlap the second opening OP2 in the third direction DR3. However, the disclosure is not limited thereto. For example, the first opening OP1 may partially overlap the second opening OP2 or may not overlap the second opening OP2. In case that the first opening OP1 and the second opening OP2 completely overlap each other, the surface area of the first opening OP1 may be less than that of the second opening OP2, but the disclosure is not limited thereto.

Furthermore, the first opening OP1 may completely overlap the third opening OP3 in the third direction DR3. However, the disclosure is not limited thereto. For example, the first opening OP1 may partially overlap the third opening OP3 or may not overlap the third opening OP3. In case that the first opening OP1 and the third opening OP3 completely overlap each other, the surface area of the first opening OP1 may be less than that of the third opening OP3, but the disclosure is not limited thereto. Furthermore, the surface area of the third opening OP3 may be substantially the same as that of the second opening OP2, but the disclosure is not limited thereto.

Detailed descriptions of the first to third openings OP1, OP2, and OP3 have been described with reference to FIGS. 1 to 7, and repetitive descriptions thereof will be omitted.

Figure 10:
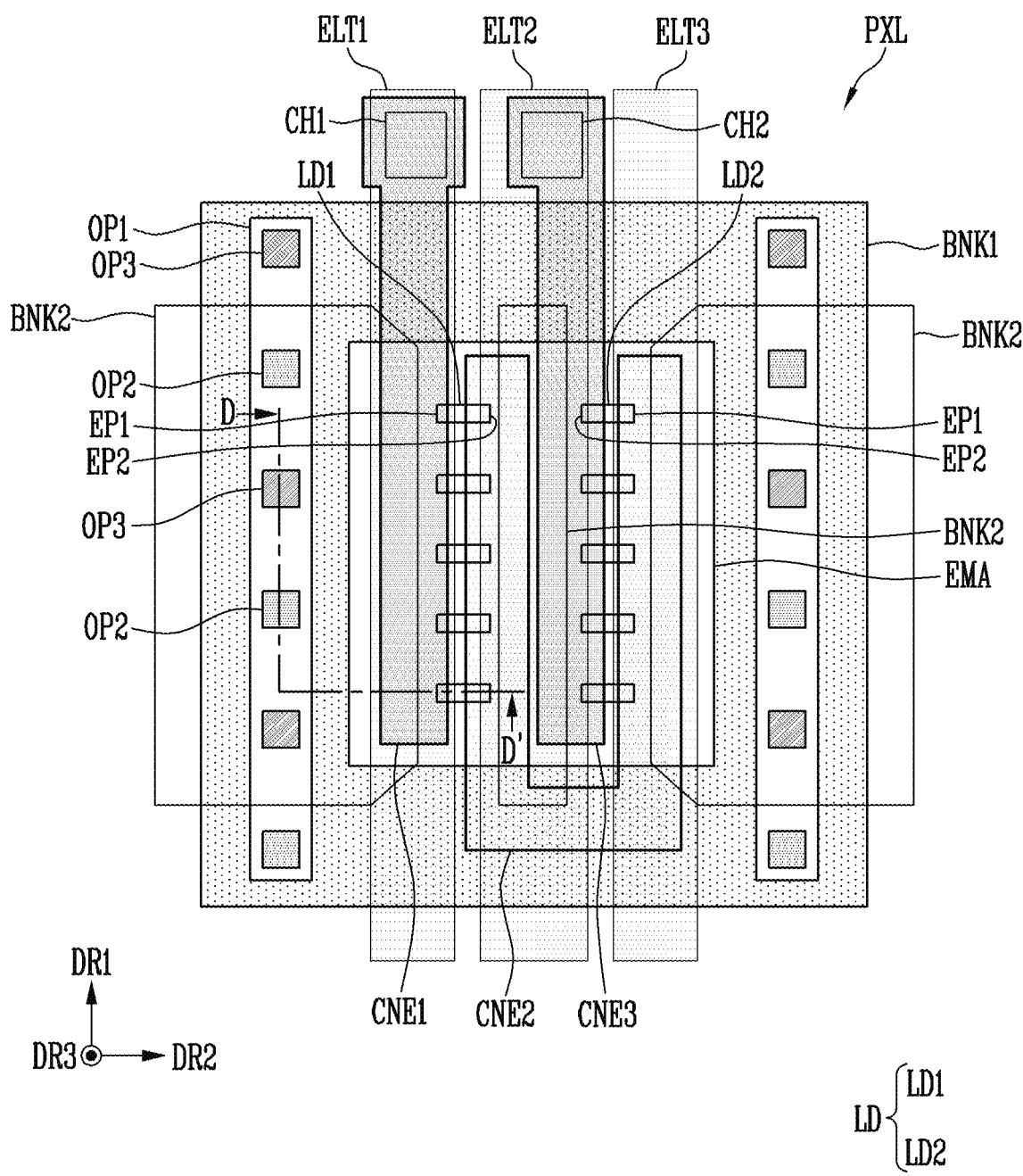
FIG. 10 is a plan view schematically illustrating a pixel in accordance with an embodiment.
Figure 11:
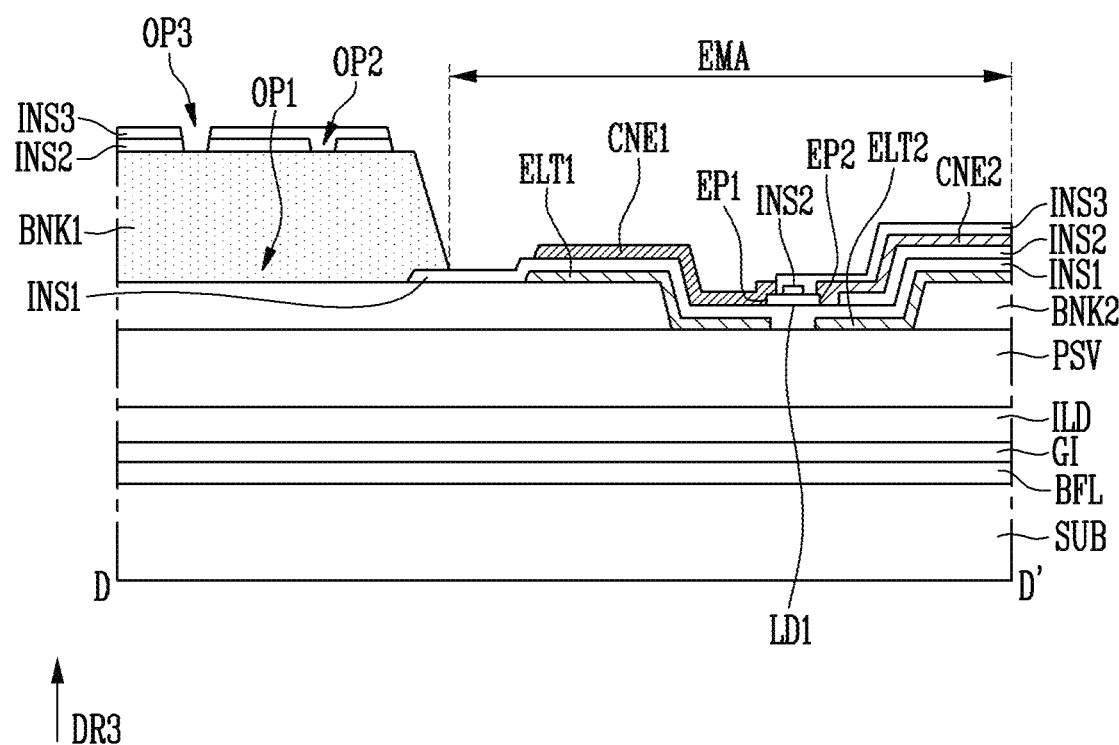
FIG. 11 is a schematic cross-sectional view taken along line D-D' of FIG. 10.

FIG. 10 is a schematic plan view illustrating a pixel in accordance with an embodiment. FIG. 11 is a schematic sectional view taken along line D-D' of FIG. 10.

Referring to FIGS. 10 and 11, the display device in accordance with the embodiment differs from the embodiment of FIGS. 1 to 7 at least in that the first openings OP1 extend in the first direction DR1.

In detail, the first openings OP1 may extend in the first direction DR1, and the second openings OP2 and/or the third openings OP3 may be spaced apart from each other in the first direction DR1. For example, the second openings OP2 and the third openings OP3 may be disposed alternately with each other in the first direction DR1. In other words, each second opening OP2 may be disposed between adjacent third openings OP3, and each third opening OP3 may be disposed between adjacent second openings OP2. However, the disclosure is not limited thereto, and the arrangement and positions of the first to third openings OP1, OP2, and OP3 may be changed in various ways so long as the first to third openings OP1, OP2, and OP3 overlap the first bank BNK1. For example, the first openings OP1 may extend not only in the first direction DR1 but also in various directions, and the second openings OP2 and/or the third openings OP3 may be spaced apart from each other not only in the first direction DR1 but also in various directions. The second openings OP2 may be successively disposed in the first direction DR1, and the third openings OP3 may be successively disposed in the first direction DR1.

Each second opening OP2 may overlap the corresponding first opening OP1 in the third direction DR3. Although FIG. 10 illustrates the case where the entirety of each second opening OP2 overlaps the corresponding first opening OP1, the disclosure is not limited thereto. In other words, each second opening OP2 may partially overlap the corresponding first opening OP1 or may not overlap the first opening OP1. The surface area of the second opening OP2 may differ from that of the first opening OP1. For example, the surface area of the second opening OP2 may be less than that of the first opening OP1, but the disclosure is not limited thereto.

Each third opening OP3 may overlap the corresponding first opening OP1 in the third direction DR3. Although FIG. 10 illustrates the case where the entirety of each third opening OP3 overlaps the corresponding first opening OP1, the disclosure is not limited thereto. In other words, each third opening OP3 may partially overlap the corresponding first opening OP1 or may not overlap the first opening OP1. The surface area of the third opening OP3 may differ from that of the first opening OP1. For example, the surface area of the third opening OP3 may be less than that of the first opening OP1, but the disclosure is not limited thereto. Furthermore, the surface area of the third opening OP3 may be substantially the same as that of the second opening OP2, but the disclosure is not limited thereto.

Detailed descriptions of the first to third openings OP1, OP2, and OP3 have been described with reference to FIGS. 1 to 7, and repetitive descriptions thereof will be omitted.

Figure 12:
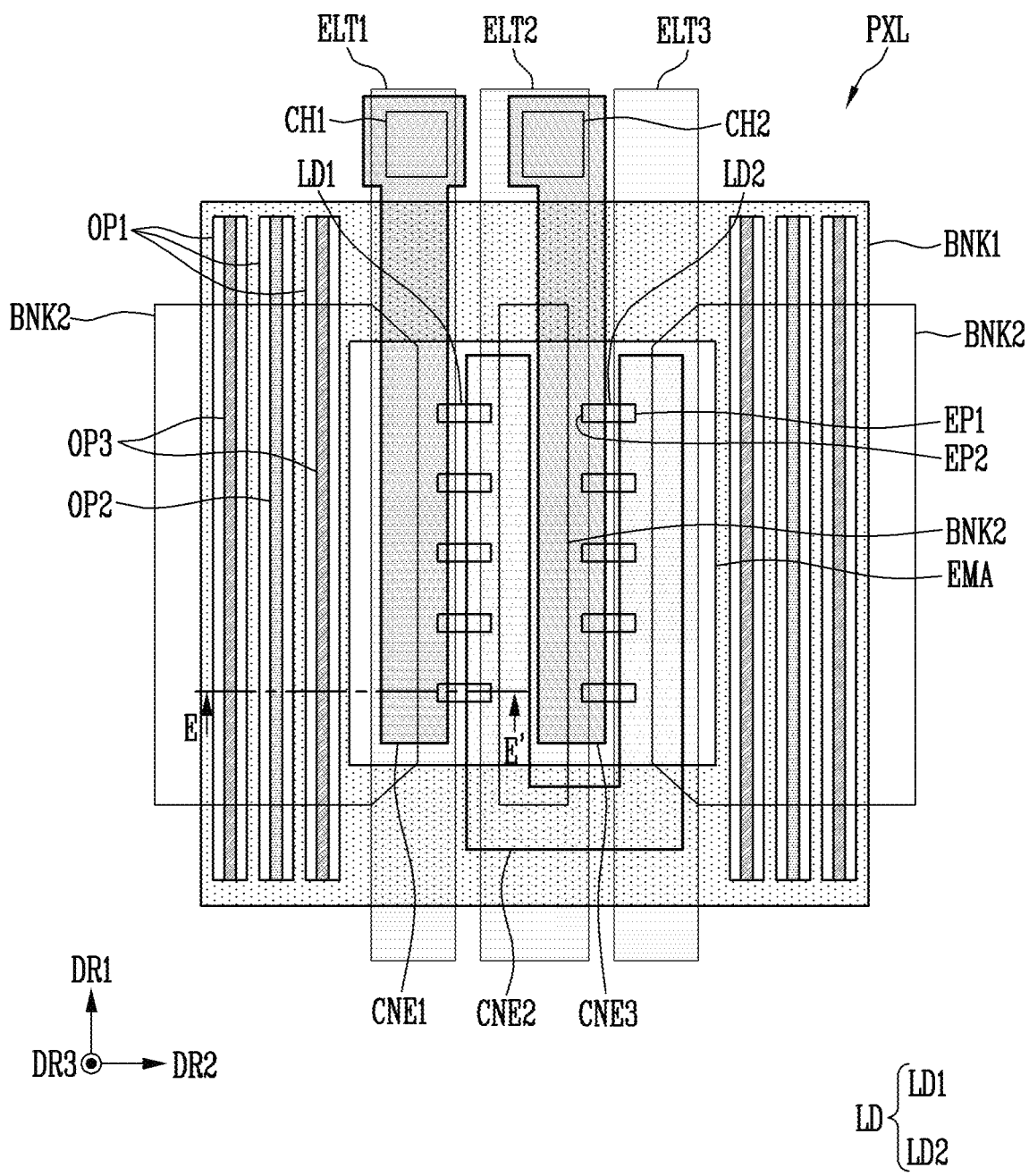
FIG. 12 is a plan view schematically illustrating a pixel in accordance with an embodiment.
Figure 13:
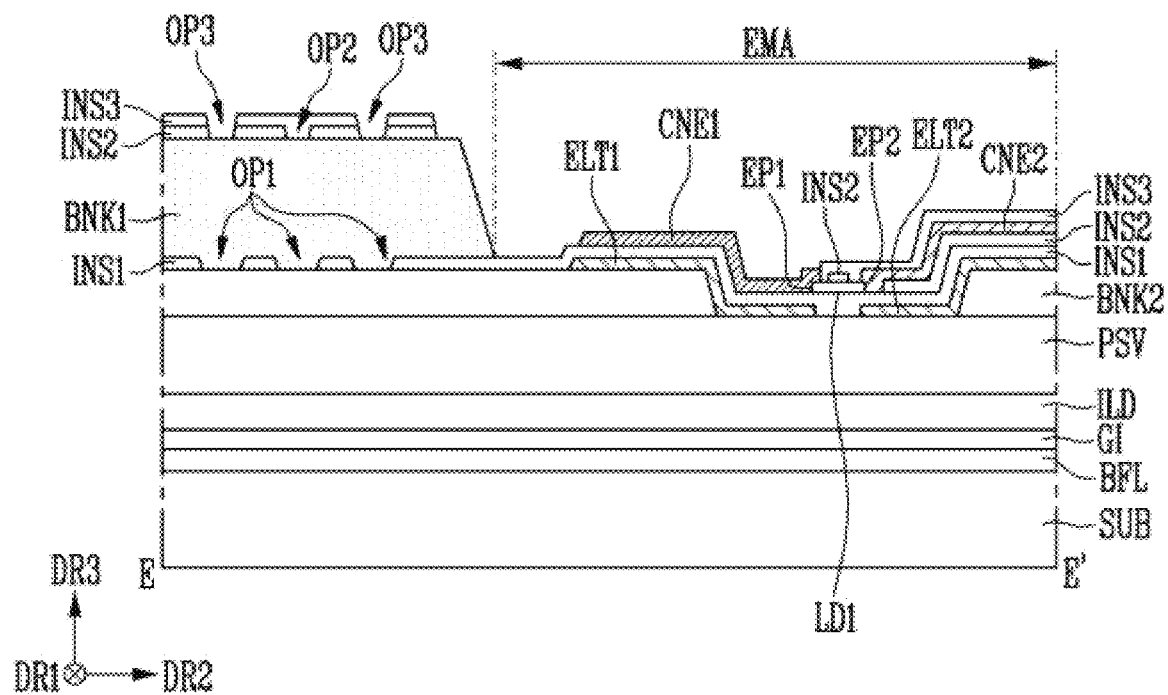
FIG. 13 is a schematic cross-sectional view taken along line E-E' of FIG. 12.

FIG. 12 is a schematic plan view illustrating a pixel in accordance with an embodiment. FIG. 13 is a schematic sectional view taken along line E-E' of FIG. 12.

Referring to FIGS. 12 and 13, the display device in accordance with the embodiment differs from that in the embodiment of FIGS. 1 to 7 at least in that that first to third openings OP1, OP2, and OP3 extend in the first direction DR1.

In detail, the first openings OP1 may extend in the first direction DR1 and be spaced apart from each other in the second direction DR2. The second openings OP2 and/or the third openings OP3 may extend in the first direction DR1 and be spaced apart from each other in the second direction DR2. The second openings OP2 and the third openings OP3 may be disposed alternately with each other in the second direction DR2. In other words, each second opening OP2 may be disposed between adjacent third openings OP3. However, the disclosure is not limited thereto, and the arrangement and positions of the first to third openings OP1, OP2, and OP3 may be changed in various ways so long as the first to third openings OP1, OP2, and OP3 overlap the first bank BNK1. For example, the first to third openings OP1, OP2, and OP3 may extend not only in the first direction DR1 but also in various directions.

Each second opening OP2 may overlap the corresponding first opening OP1 in the third direction DR3. Although FIG. 12 illustrates the case where the entirety of each second opening OP2 overlaps the corresponding first opening OP1, the disclosure is not limited thereto. In other words, each second opening OP2 may partially overlap the corresponding first opening OP1 or may not overlap the first opening OP1. The surface area of the second opening OP2 may differ from that of the first opening OP1. For example, the surface area of the second opening OP2 may be less than that of the first opening OP1, but the disclosure is not limited thereto.

Each third opening OP3 may overlap the corresponding first opening OP1 in the third direction DR3. Although FIG. 12 illustrates the case where the entirety of each third opening OP3 overlaps the corresponding first opening OP1, the disclosure is not limited thereto. In other words, each third opening OP3 may partially overlap the corresponding first opening OP1 or may not overlap the first opening OP1. The surface area of the third opening OP3 may differ from that of the first opening OP1. For example, the surface area of the third opening OP3 may be less than that of the first opening OP1, but the disclosure is not limited thereto. Furthermore, the surface area of the third opening OP3 may be substantially the same as that of the second opening OP2, but the disclosure is not limited thereto.

Detailed descriptions of the first to third openings OP1, OP2, and OP3 have been described with reference to FIGS. 1 to 7, and repetitive descriptions thereof will be omitted.

Figure 14:
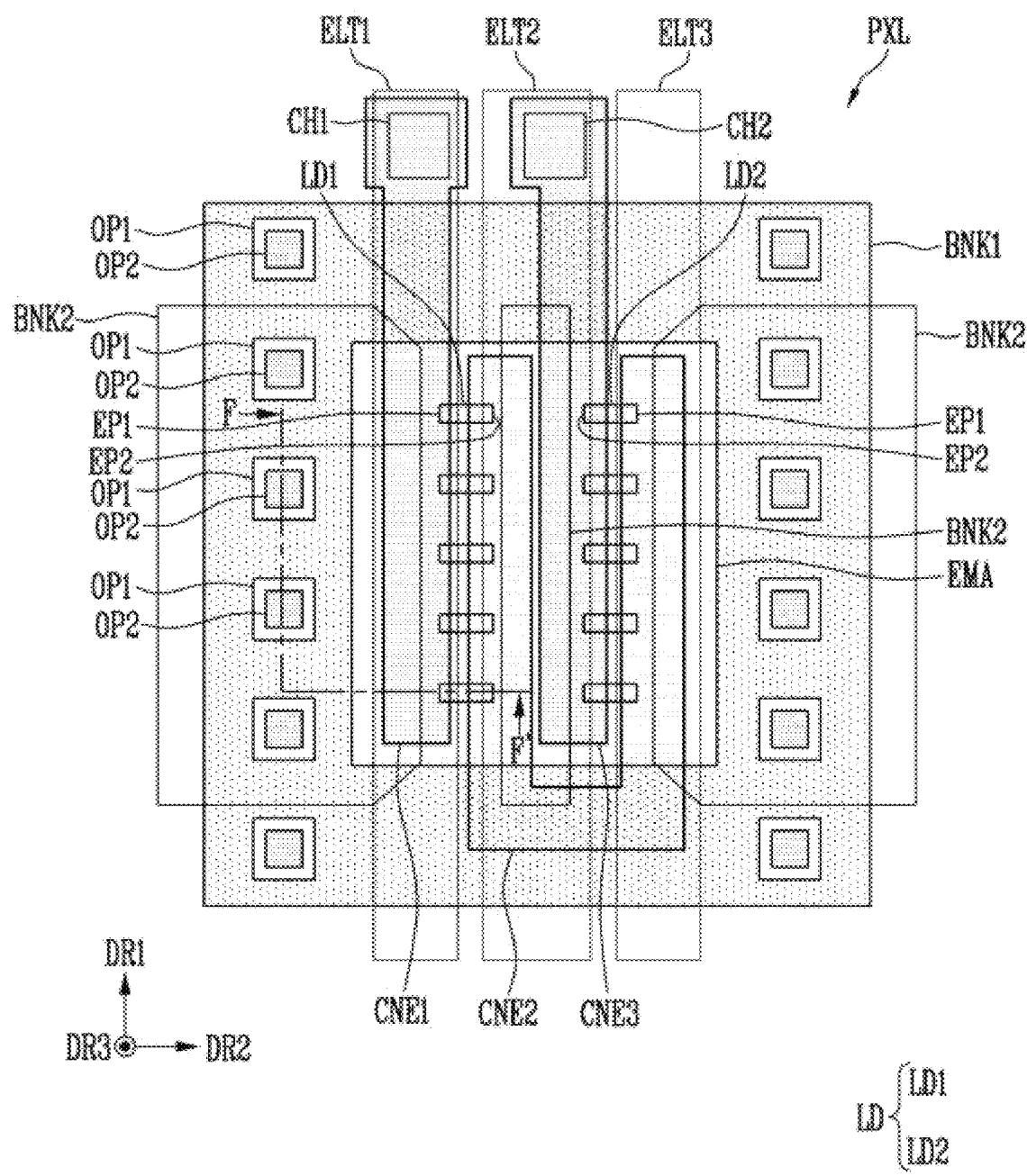
FIG. 14 is a plan view schematically illustrating a pixel in accordance with an embodiment.
Figure 15:
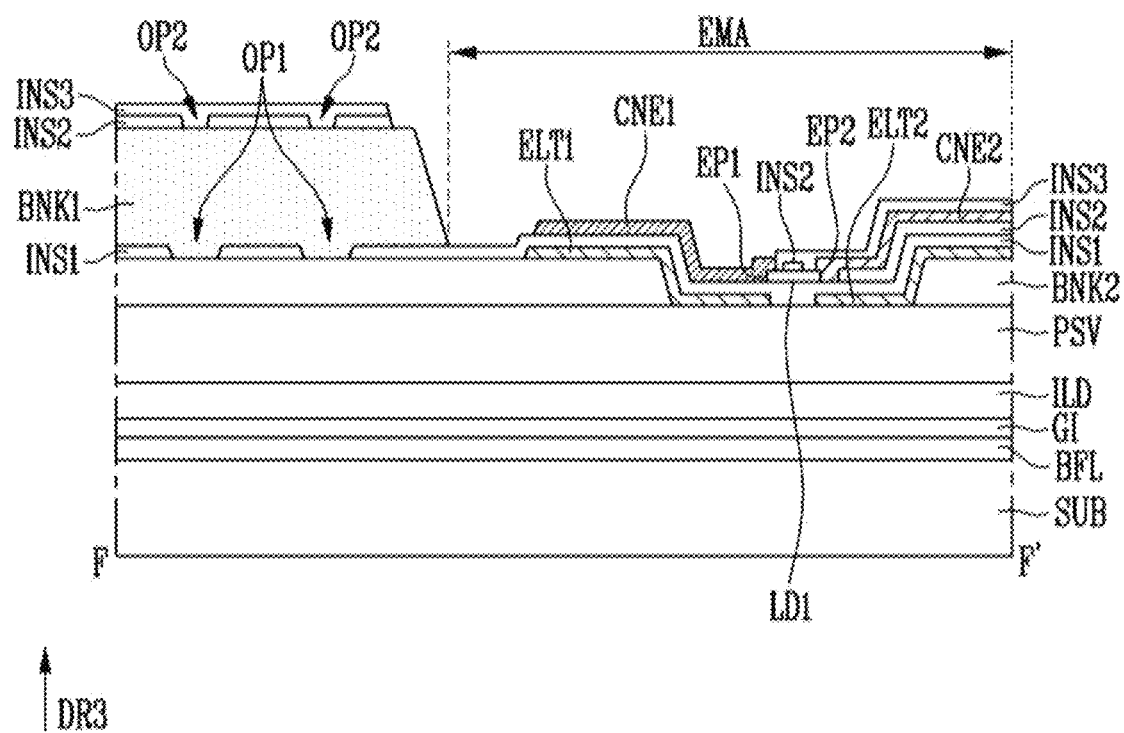
FIG. 15 is a schematic cross-sectional view taken along line F-F' of FIG. 14.

FIG. 14 is a schematic plan view illustrating a pixel in accordance with an embodiment. FIG. 15 is a schematic sectional view taken along line F-F' of FIG. 14.

Referring to FIGS. 14 and 15, the display device in accordance with the embodiment differs from that of the embodiment of FIGS. 1 to 7 at least in that the third opening OP3 is omitted.

In detail, the pixel PXL may include first openings OP1 and second openings OP2 disposed around the emission area EMA.

The first openings OP1 and the second openings OP2 each may overlap the first bank BNK1. The first openings OP1 may be spaced apart from each other. For example, as illustrated in FIG. 14, the first openings OP1 may be spaced apart from each other in the first direction DR1. However, the disclosure is not limited thereto, and the arrangement and position of the first openings OP1 may be changed in various ways so long as the first openings OP1 overlap the first bank BNK1.

The second openings OP2 may be spaced apart from each other. For example, as illustrated in FIG. 14, the second openings OP2 may be spaced apart from each other in the first direction DR1. However, the disclosure is not limited thereto, and the arrangement and position of the second openings OP2 may be changed in various ways so long as the second openings OP2 overlap the first bank BNK1.

The second openings OP2 may overlap the first openings OP1. Although FIG. 14 illustrates the case where the entirety of each second opening OP2 overlaps the corresponding first opening OP1, the disclosure is not limited thereto. In other words, each second opening OP2 may partially overlap the corresponding first opening OP1 or may not overlap the first opening OP1. The surface area of the second opening OP2 may differ from that of the first opening OP1. For example, the surface area of the second opening OP2 may be less than that of the first opening OP1, but the disclosure is not limited thereto.

Detailed descriptions of the first openings OP1 and the second openings OP2 have been described with reference to FIGS. 1 to 7, and repetitive descriptions thereof will be omitted.

Figure 16:
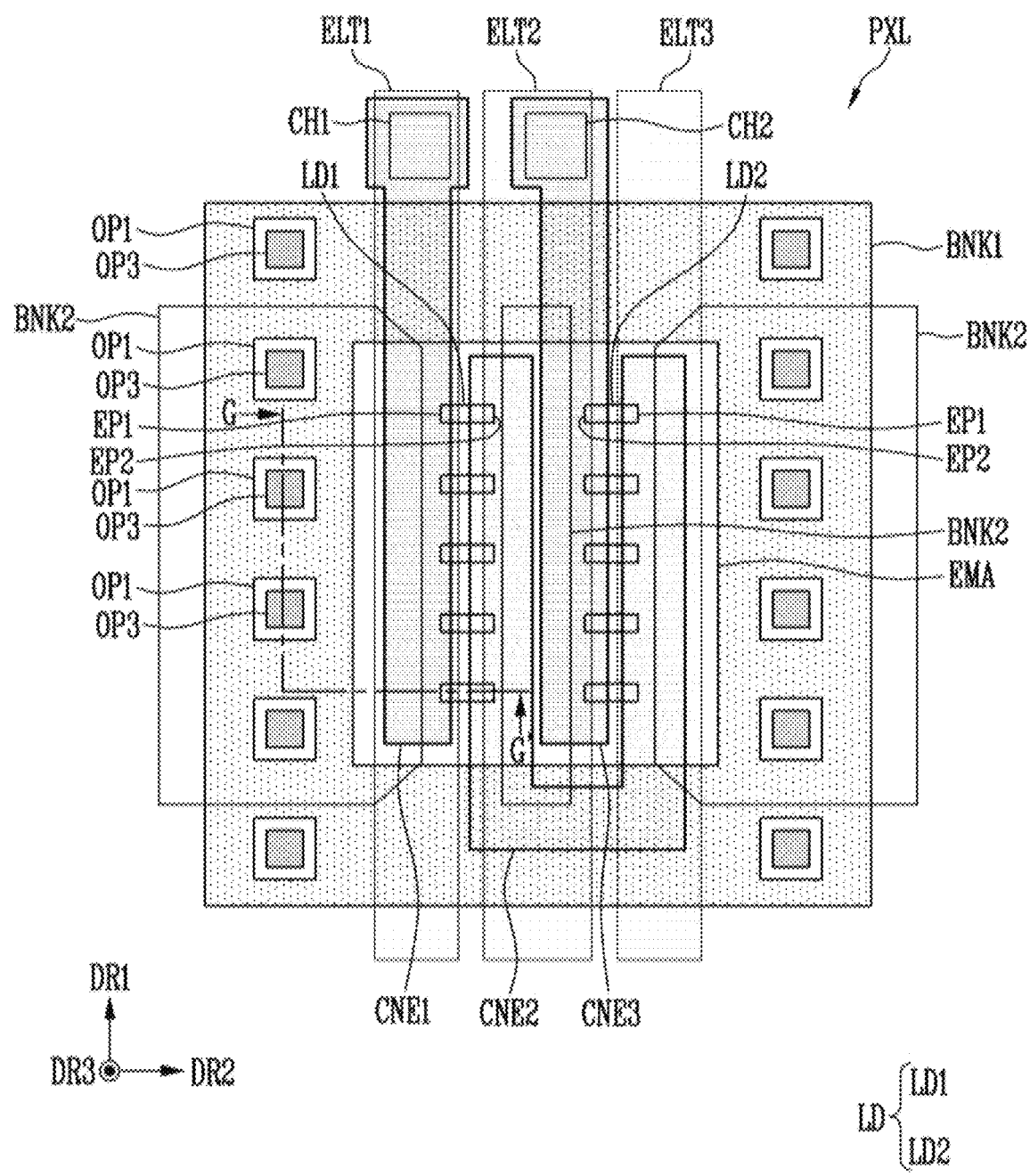
FIG. 16 is a plan view schematically illustrating a pixel in accordance with an embodiment.
Figure 17:
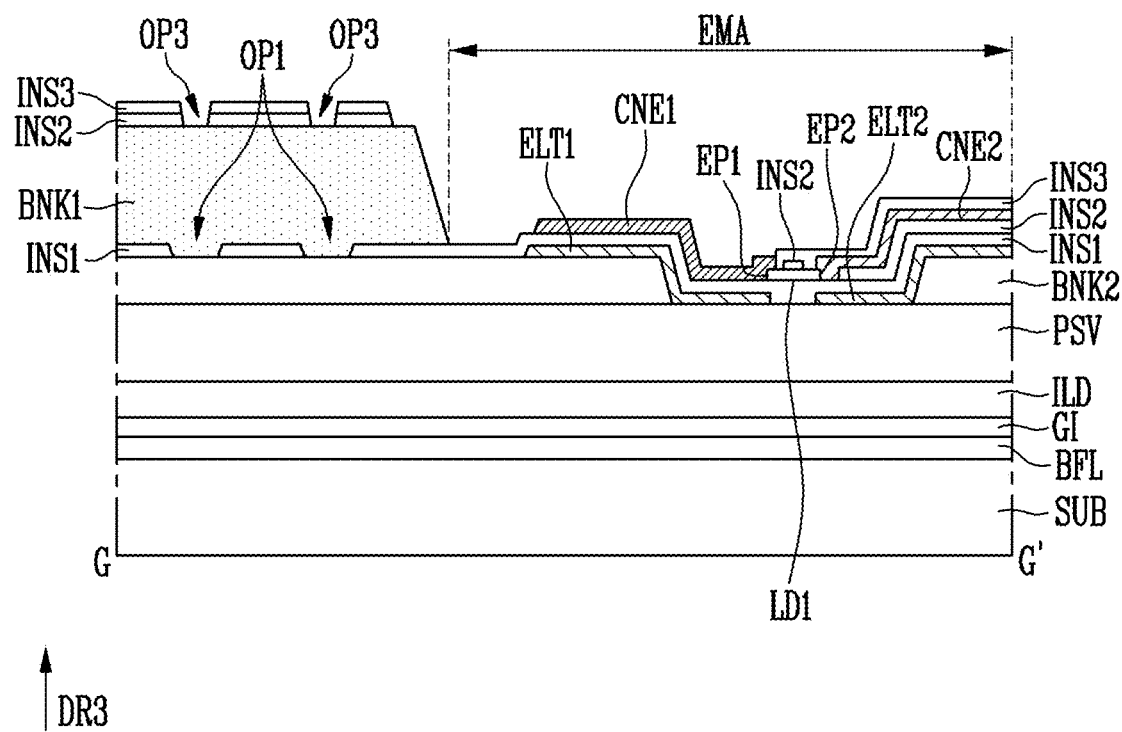
FIG. 17 is a schematic cross-sectional view taken along line G-G' of FIG. 16.

FIG. 16 is a schematic plan view illustrating a pixel in accordance with an embodiment. FIG. 17 is a schematic sectional view taken along line G-G' of FIG. 16.

Referring to FIGS. 16 and 17, the display device in accordance with the embodiment differs from that of the embodiment of FIGS. 1 to 7 at least in that the second opening OP2 is omitted.

In detail, the pixel PXL may include first openings OP1 and third openings OP3 disposed around the emission area EMA.

The first openings OP1 and the third openings OP3 each may overlap the first bank BNK1. The first openings OP1 may be spaced apart from each other. For example, as illustrated in FIG. 16, the first openings OP1 may be spaced apart from each other in the first direction DR1. However, the disclosure is not limited thereto, and the arrangement and position of the first openings OP1 may be changed in various ways so long as the first openings OP1 overlap the first bank BNK1.

The third openings OP3 may be spaced apart from each other. For example, as illustrated in FIG. 16, the second openings OP2 may be spaced apart from each other in the first direction DR1. However, the disclosure is not limited thereto, and the arrangement and position of the third openings OP3 may be changed in various ways so long as the third openings OP3 overlap the first bank BNK1.

The third openings OP3 may overlap the first openings OP1. Although FIG. 16 illustrates the case where the entirety of each third opening OP3 overlaps the corresponding first opening OP1, the disclosure is not limited thereto. In other words, each third opening OP3 may partially overlap the corresponding first opening OP1 or may not overlap the first opening OP1. The surface area of the third opening OP3 may differ from that of the first opening OP1. For example, the surface area of the third opening OP3 may be less than that of the first opening OP1, but the disclosure is not limited thereto.

Detailed descriptions of the first openings OP1 and the third openings OP3 have been described with reference to FIGS. 1 to 7, and repetitive descriptions thereof will be omitted.

In accordance with an embodiment, even if outgas is generated from an organic layer during a process of fabricating the display device, the outgas can be discharged outward through an opening formed in the insulating layer. Therefore, defects attributable to the outgas may be reduced or minimized.

The effects of the disclosure are not limited by the foregoing, and various other effects are anticipated herein.

It will be understood by those skilled in the art that various changes in form and details may be made therein without departing from the spirit and scope of the disclosure as defined by the appended claims. Therefore, the foregoing embodiments should be considered in descriptive sense only and not for purposes of limitation. The scope of the claimed invention is defined not by the detailed description of the disclosure but by the appended claims, and all differences within the scope will be construed as being included in the disclosure.

What is claimed is:

1. A display device comprising:
    a substrate including pixels;
    a first bank that defines an emission area of the pixels;
    a first electrode and a second electrode spaced apart from each other in the emission area;
    a first insulating layer disposed on the first electrode and the second electrode;
    light emitting elements disposed on the first insulating layer between the first electrode and the second electrode;
    a second insulating layer disposed on the first bank;
    a first opening passing through the first insulating layer; and
    a second opening passing through the second insulating layer, wherein
    the first opening and the second opening overlap the first bank, and
    an end of each of the light emitting elements is electrically connected to one of the first and second electrodes and another end of each of the light emitting elements is electrically connected to the other one of the first and second electrodes such that the light emitting elements emit light in case that a difference in potential between the first and second electrodes is equal to or greater than a threshold voltage.

2. The display device according to claim 1, wherein the second opening exposes the first bank.

3. The display device according to claim 1, wherein the first opening overlaps the second opening.

4. The display device according to claim 1, wherein a surface area of the first opening is greater than a surface area of the second opening.

5. The display device according to claim 1, wherein a surface area of the first opening is less than a surface area of the second opening.

6. The display device according to claim 1, wherein the first opening and the second opening extend in a first direction.

7. The display device according to claim 1, wherein the first bank is disposed between the first insulating layer and the second insulating layer.

8. The display device according to claim 1, further comprising a second bank disposed between the substrate and the first bank.

9. The display device according to claim 8, wherein the first opening exposes the second bank.

10. The display device according to claim 8, wherein the first bank contacts the second bank through the first opening.

11. The display device according to claim 1, further comprising:
    a third insulating layer disposed on the second insulating layer; and
    a third opening passing through the second insulating layer and the third insulating layer.

12. The display device according to claim 11, wherein the third opening overlaps the first bank.

13. The display device according to claim 11, wherein the third opening exposes the first bank.

14. The display device according to claim 11, wherein the third insulating layer contacts the first bank through the second opening.

15. The display device according to claim 11, wherein the second opening and the third opening are disposed alternately with each other in a first direction.

16. The display device according to claim 11, wherein the second opening and the third opening extend in a first direction.

17. The display device according to claim 16, wherein the second opening and the third opening are spaced apart from each other in a second direction intersecting the first direction.

18. The display device according to claim 11, further comprising:
    a first connection electrode disposed on the third insulating layer; and
    a second connection electrode disposed between the second insulating layer and the third insulating layer.

19. The display device according to claim 18, wherein
    the first connection electrode electrically contacts the end of each of the light emitting elements, and
    the second connection electrode electrically contacts the another end of each of the light emitting elements.

20. The display device according to claim 11, wherein at least one of the first insulating layer, the second insulating layer, and the third insulating layer includes an inorganic material.

21. The display device according to claim 1, further comprising:
    a passivation layer; and
    a transistor, wherein
    the first and second electrodes are disposed on the passivation layer, and
    a transistor is disposed under the passivation layer.

22. The display device according to claim 1, wherein
    the first electrode is electrically connected to a first electrode of a transistor that is electrically connected to a first power supply, and
    the second electrode is electrically connected to a second power supply.

23. The display device according to claim 1, wherein each of the light emitting elements has a columnar shape.

* * * * *